(12) United States Patent
Huang

(10) Patent No.: US 11,424,187 B2
(45) Date of Patent: Aug. 23, 2022

(54) SEMICONDUCTOR DEVICE WITH POROUS INSULATING LAYERS AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 25 days.

(21) Appl. No.: 16/984,828

(22) Filed: Aug. 4, 2020

(65) Prior Publication Data

US 2022/0045006 A1    Feb. 10, 2022

(51) Int. Cl.
| | | |
|---|---|---|
| H01L 23/535 | (2006.01) | |
| H01L 21/02 | (2006.01) | |
| H01L 21/768 | (2006.01) | |
| H01L 23/522 | (2006.01) | |
| H01L 23/532 | (2006.01) | |

(52) U.S. Cl.
CPC ...... *H01L 23/535* (2013.01); *H01L 21/02203* (2013.01); *H01L 21/76805* (2013.01); *H01L 21/76895* (2013.01); *H01L 23/5329* (2013.01); *H01L 23/53276* (2013.01)

(58) Field of Classification Search
CPC ......... H01L 21/02203; H01L 21/76805; H01L 21/76895; H01L 23/53276; H01L 23/535; H01L 23/5329
See application file for complete search history.

(56) References Cited

U.S. PATENT DOCUMENTS

| | | | |
|---|---|---|---|
| 2006/0151887 A1* | 7/2006 | Oh | H01L 23/53295 257/E23.145 |
| 2007/0093078 A1* | 4/2007 | Harada | H01L 21/02362 257/E21.273 |
| 2008/0042282 A1* | 2/2008 | Saito | H01L 21/76843 257/751 |
| 2013/0015581 A1* | 1/2013 | Wann | H01L 23/53276 438/653 |

* cited by examiner

*Primary Examiner* — Herve-Louis Y Assouman
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes.

8 Claims, 25 Drawing Sheets

SEMICONDUCTOR DEVICE WITH POROUS INSULATING LAYERS AND METHOD FOR FABRICATING THE SAME

TECHNICAL FIELD

The present disclosure relates to a semiconductor device and a method for fabricating the semiconductor device, and more particularly, to a semiconductor device with porous insulating layers and a method for fabricating the semiconductor device with porous insulating layers.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a top contact positioned above the substrate, a top conductive layer positioned on the top contact, porous insulating layers positioned on two sides of the top contact, first framework layers positioned on bottom surfaces of the porous insulating layers and sidewalls of the porous insulating layers, and a second framework layer positioned between the top contact and the porous insulating layers, positioned on bottom surface of the top contact, and positioned on top surface of the porous insulating layers.

In some embodiments, the semiconductor device further includes covering layers positioned between the top contact and the second framework layer positioned between the top contact and the porous insulating layers.

In some embodiments, the first framework layers and the second framework layer are formed of a material including carbons having hexagonal crystal structures.

In some embodiments, the first framework layers and the second framework layer are formed graphene, graphite, or the like.

In some embodiments, thicknesses of the covering layers are gradually decreased toward the substrate.

In some embodiments, bottommost points of the covering layers are contacting the second framework layer positioned on the bottom surface of the top contact.

In some embodiments, the covering layers are formed of aluminum carbide, aluminum nitride, tungsten carbide, or tungsten nitride.

In some embodiments, porosities of the porous insulating layers are between about 30% and about 95%.

In some embodiments, the semiconductor device further includes a bottom conductive layer below the top contact and a bottom contact positioned below the bottom conductive layer. A width of the top contact is equal to or less than a width of the bottom contact.

In some embodiments, the semiconductor device further includes spacers positioned on sidewalls of the top conductive layer.

Another aspect of the present disclosure provides a semiconductor device including a substrate, a top contact positioned above the substrate, a top conductive layer positioned on the top contact, porous insulating layers positioned on two sides of the top contact, a first framework layer positioned on bottom surfaces of the porous insulating layers, sidewalls of the porous insulating layers, and on bottom surface of the top contact, and a second framework layer positioned between the top contact and the porous insulating layers, between the top contact and the first framework layers, and positioned on top surface of the porous insulating layers.

In some embodiments, the semiconductor device further includes covering layers positioned between the top contact and the second framework layer positioned between the top contact and the porous insulating layers.

Another aspect of the present disclosure provides a method for fabricating a semiconductor device including providing a substrate, forming an insulating layer above the substrate, forming a first opening in the insulating layer, conformally forming a first framework layer in the first opening, forming an energy-removable layer on the first framework layer and filling the first opening, forming a second opening along the energy-removable layer and the first framework layer, conformally forming a second framework layer in the second opening, forming a top contact on the second framework layer and filling the second opening and forming a top conductive layer on the top contact, and performing an energy treatment to transform the energy-removable layer into porous insulating layers on two sides of the top contact.

In some embodiments, the method for fabricating the semiconductor device includes a step of forming covering layers on sidewalls of the second framework layer and in the second opening.

In some embodiments, the covering layers are formed of aluminum carbide, aluminum nitride, tungsten carbide, or tungsten nitride.

In some embodiments, the first framework layer and the second framework layer are formed of a material including carbons having hexagonal crystal structures.

In some embodiments, porosities of the porous insulating layers are between about 30% and about 95%.

In some embodiments, the energy-removable layer includes abase material and a decomposable porogen material.

In some embodiments, the base material includes methylsilsesquioxane, low-dielectric materials, or silicon oxide.

In some embodiments, an energy source of the energy treatment is heat, light, or a combination thereof.

Due to the design of the semiconductor device of the present disclosure, the porous insulating layers may reduce the parasitic capacitance of the semiconductor device. In addition, with the presence of the covering layers, the top contact may be fabricated without any void. Hence, the yield of fabricating the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
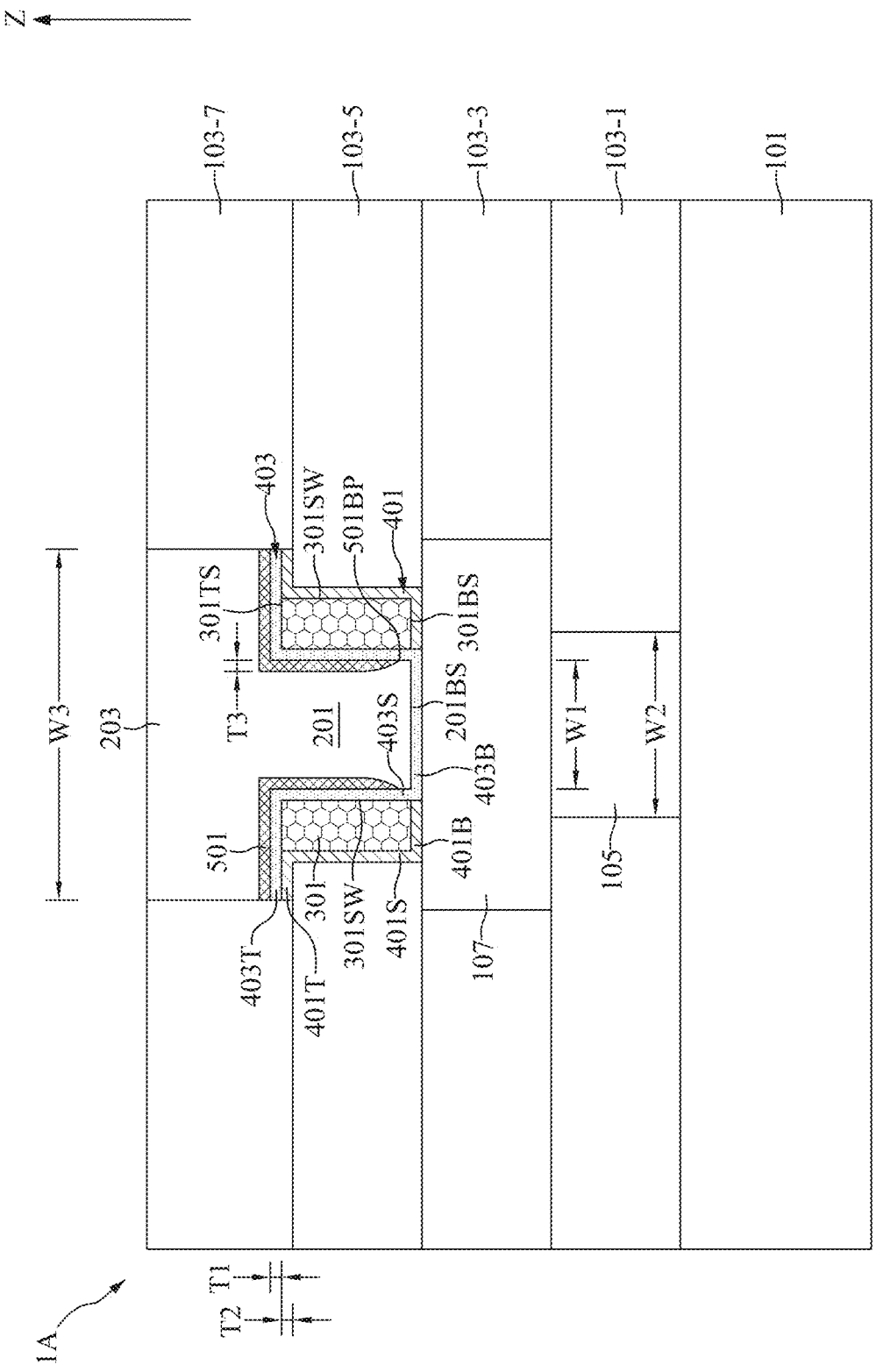
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a schematic cross-sectional view diagram, a semiconductor device 1A in accordance with one embodiment of the present disclosure.

With reference to FIG. 1, the semiconductor device 1A may include a substrate 101, first insulating layers 103-1, 103-3, 103-5, 103-7, a bottom contact 105, a bottom conductive layer 107, a top contact 201, a top conductive layer 203, porous insulating layers 301, first framework layers 401, second framework layer 403, and covering layers 501.

With reference to FIG. 1, in some embodiments, the substrate 101 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; a non-semiconductor material, such as soda-lime glass, fused silica, fused quartz, calcium fluoride; other suitable materials; or combinations thereof.

In some embodiments, the substrate 101 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

In some embodiments, the substrate 101 may include dielectrics, insulating layers, or conductive features disposed on the bulk semiconductor substrate or the topmost semiconductor material layer. The dielectrics or the insulating layers may be formed of, for example, silicon oxide, silicon nitride, silicon oxynitride, silicon nitride oxide, borophosilicate glass, undoped silicate glass, fluorinated silicate glass, low-k dielectric materials, the like, or a combination thereof. Each of the dielectrics or each of the insulating layers may have a thickness between about 0.5 micrometer and about 3.0 micrometer. The low-k dielectric materials may have a dielectric constant less than 3.0 or even less than 2.5. The conductive features may be conductive lines, conductive vias, conductive contacts, or the like.

It should be noted that, in description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

In some embodiments, device elements (not shown) may be disposed in the substrate 101. The device elements may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices. The device elements may be electrically insulated from neighboring device elements by insulating structures such as shallow trench isolation.

With reference to FIG. 1, the first insulating layers 103-1, 103-3, 103-5, 103-7 may be stacked on the substrate 101. The first insulating layers 103-1, 103-3, 103-5, 103-7 may be formed of, for example, silicon oxide, silicon nitride, silicon oxynitride, silicon nitride oxide, borophosphosilicate glass, undoped silicate glass, fluorinated silicate glass, low-k dielectric materials, the like, or a combination thereof. The first insulating layers 103-1, 103-3, 103-5, 103-7 may be formed of a same material but are not limited thereto. Each of the first insulating layers 103-1, 103-3, 103-5, 103-7 may have a thickness between about 0.5 micrometer and about 3.0 micrometer. The low-k dielectric materials may have a dielectric constant less than 3.0 or even less than 2.5.

With reference to FIG. 1, the bottom contact 105 may be disposed in the first insulating layer 103-1. The bottom contact 105 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The bottom contact 105 may be electrically coupled to the device elements in the substrate 101.

With reference to FIG. 1, the bottom conductive layer 107 may be disposed on the bottom contact 105 and in the first insulating layer 103-3. The bottom conductive layer 107 may be formed of, for example, copper, aluminum, titanium, tungsten, the like, or a combination thereof. The bottom conductive layer 107 may be electrically connected to the bottom contact 105.

With reference to FIG. 1, the top contact 201 may be disposed on the bottom conductive layer 107. The top contact 201 may be disposed in the first insulating layer 103-5 and a lower portion of the first insulating layer 103-7. In a cross-sectional perspective, a width W1 of the top contact 201 may be equal to or less than a width W2 of bottom contact 105. The top contact 201 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The top contact 201 may be electrically coupled to the bottom conductive layer 107.

With reference to FIG. 1, the top conductive layer 203 may be disposed on the top contact 201. The top conductive layer 203 may be disposed in the first insulating layer 103-7. In a cross-sectional perspective, a width W3 of the top conductive layer 203 may be greater than the width W1 of the top contact 201. In some embodiments, the top conductive layer 203 may be symmetrically disposed on the top contact 201. In some embodiments, the top conductive layer 203 may be asymmetrically disposed on the top contact 201. The top conductive layer 203 may be formed of a same material as the top contact 201.

With reference to FIG. 1, the porous insulating layers 301 may be respectively correspondingly disposed on two sides of the top contact 201. The porous insulating layers 301 may be disposed in the first insulating layer 103-5 and in the lower portion of the first insulating layer 103-7. For convenience of description, only one porous insulating layer 301 is described.

The porous insulating layer 301 may be formed from an energy-removable material. The porous insulating layer 301 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. In some embodiments, the porous insulating layer 301 may have a porosity between about 30% and about 95%. In some embodiments, the porosity of the porous insulating layer 301 may be between about 50% and about 85%. The plurality of empty spaces of the porous insulating layer 301 may be filled with air. As a result, a dielectric constant of the porous insulating layer 301 may be significantly lower than a layer formed of, for example, silicon oxide. Therefore, the porous insulating layer 301 may significantly reduce the parasitic capacitance between the top contact 201 and horizontally neighboring conductive elements (not shown in FIG. 1 for clarity). That is, the porous insulating layers 301 may significantly alleviate an interference effect between electrical signals induced or applied to the top contact 201.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source.

With reference to FIG. 1, the first framework layers 401 may be disposed between the bottom conductive layer 107 and the porous insulating layers 301, between the first insulating layer 103-5 and the porous insulating layers 301, and between the top conductive layer 203 and the first insulating layer 103-5.

For convenience of description, only one first framework layer 401 is described. Specifically, the first framework layers 401 may include a bottom portion 401B, a side portion 401S, and a top portion 401T. The bottom portion 401B, the side portion 401S, and the top portion 401T may be line shape. The side portion 401S may connect the bottom portion 401B and the top portion 401T.

The bottom portion 401B of the first framework layer 401 may be disposed on the bottom surface 301BS of the porous insulating layer 301. In other words, the bottom portion 401B of the first framework layer 401 is disposed between the bottom conductive layer 107 and the porous insulating layers 301.

The side portion 401S of the first framework layer 401 may be disposed on the sidewall 301SW, which opposite to the top contact 201, of the porous insulating layers 301. In other words, the side portion 401S of the first framework layer 401 may be disposed between the first insulating layer 103-5 and the porous insulating layers 301.

The top portion 401T of the first framework layer 401 may be disposed between the bottom surface of the top conductive layer 203 and the first insulating layer 103-5.

In some embodiments, the first framework layers 401 may be formed of, for example, a material including $sp^2$ hybridized carbon atoms. In some embodiments, the first framework layers 401 may be formed of, for example, a material including carbons having hexagonal crystal structures. In some embodiments, the first framework layers 401 may be formed of, for example, graphene, graphite, or the like.

With reference to FIG. 1, the second framework layer 403 may be disposed between the first insulating layer 103-5 and the top conductive layer 203, between the top conductive layer 203 and the porous insulating layers 301, between the top contact 201 and the porous insulating layers 301, and between the top contact 201 and the bottom conductive layer 107.

Specifically, the second framework layer 403 may include a bottom portion 403B, side portions 403S, and top portions 403T. In a cross-sectional perspective, the bottom portion 403B may be line shape and may be horizontally disposed. The side portions 403S may be line shape. The side portions 403S may be vertically connected to two ends of the bottom portion 403B. The top portions 403T may be horizontally disposed and may be respectively correspondingly connected to ends, which opposite to the bottom portion 403B, of the side portions 403S.

The bottom portion 403B of the second framework layer 403 may be disposed on the bottom surface 201BS of the top contact 201. In other words, the bottom portion 403B of the second framework layer 403 may be disposed between the top contact 201 and the bottom conductive layer 107.

The side portions 403S of the second framework layer 403 may be disposed on the sidewalls 301SW, which faced the top contact 201, of the porous insulating layers 301. In other words, the side portions 403S of the second framework layer 403 may be disposed between the top contact 201 and the porous insulating layers 301.

The top portions 403T of the second framework layer 403 may be disposed on the top surfaces 301TS of the porous insulating layers 301 and on the top portions 401T of the first framework layers 401. In other words, the top portions 403T of the second framework layer 403 may be disposed between the first insulating layer 103-5 and the top conductive layer 203 and between the top conductive layer 203 and the porous insulating layers 301.

In some embodiments, the second framework layer 403 may have a thickness T1 equal to a thickness T2 of the first framework layers 401. In some embodiments, the thickness T1 of the second framework layer 403 may be greater than the thickness T2 of the second framework layer 403. In some embodiments, the thickness T1 of the second framework layer 403 may be less than the thickness T2 of the second framework layer 403.

In some embodiments, the second framework layer 403 may be formed of a same material as the first framework layers 401. In some embodiments, the second framework layer 403 may be formed of different materials from the first framework layers 401. For example, the second framework layer 403 may be formed of a material including $sp^2$ hybridized carbon atoms. For another example, the second framework layer 403 may be formed of a material including carbons having hexagonal crystal structures. For yet another example, the second framework layer 403 may be formed of graphene, graphite, or the like.

With reference to FIG. 1, in a cross-sectional perspective, the porous insulating layers 301 may be enclosed by the first framework layers 401 and the second framework layer 403. Specifically, the porous insulating layer 301 may be enclosed by the bottom portion 401B of the first framework layer 401, the side portion 401S of the first framework layer 401, the top portion 403T of the second framework layer 403, and the side portion 403S of the second framework layer 403. The first framework layers 401 and the second framework layer 403 may provide additional mechanical supporting to the porous insulating layers 301.

With reference to FIG. 1, the covering layers 501 may be disposed covering the top portions 403T of the second framework layer 403 and the side portions 403S of the second framework layer 403. A thickness T3 of the covering layers 501 covering the side portions 403S of the second framework layer 403 may be gradually decreased toward the substrate 101. Bottommost points 501BP of the covering layers 501 may be at a vertical higher than the bottom portion 403B of the second framework layer 403. In other words, the covering layers 501 may not contact the bottom portion 403B of the second framework layer 403. The bottom portion 403B of the second framework layer 403 is not covered by the covering layers 501.

In some embodiments, the covering layers 501 may be formed of any suitable metal, metal oxide, metal carbide, metal nitride, or combination thereof. For example, the covering layers 501 may be formed of aluminum carbide, aluminum nitride, tungsten carbide, or tungsten nitride. In some embodiments, the covering layers 501 may be formed of, for example, aluminum oxide, hafnium oxide, zirconium oxide, titanium oxide, titanium nitride, tungsten nitride, silicon nitride, or silicon oxide. The covering layers 501 may be employed as wetting layers to improve the adhesion among the second framework layer 403, the top contact 201, and the top conductive layer 203.

FIGS. 2 to 6 illustrate, in schematic cross-sectional view diagram, semiconductor devices 1B, 1C, 1D, 1E, and 1F in accordance with some embodiments of the present disclosure.

Figure 2:
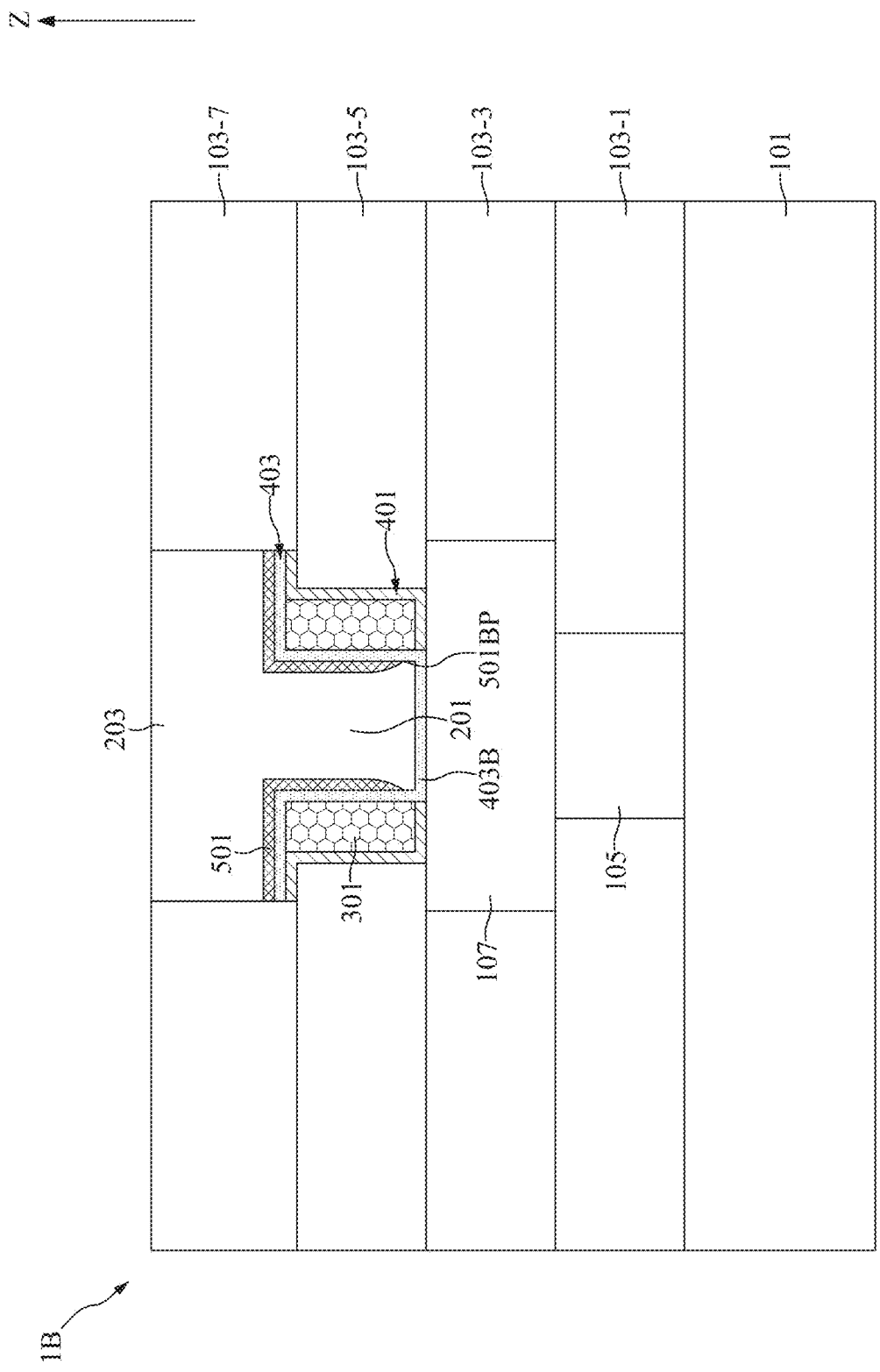
FIGS. 2 to 6 illustrate, in schematic cross-sectional view diagram, semiconductor devices in accordance with some embodiments of the present disclosure.

With reference to FIG. 2, the semiconductor device 1B may have a structure similar to that illustrated in FIG. 1. The same or similar elements in FIG. 2 as in FIG. 1 have been marked with similar reference numbers and duplicative descriptions have been omitted.

With reference to FIG. 2, the bottommost points 501BP of the covering layers 501 may contact the bottom portion 403B of the second framework layer 403. It should be noted that most of the bottom portion 403B of the second framework layer 403 is not covered by the covering layers 501.

Figure 3:
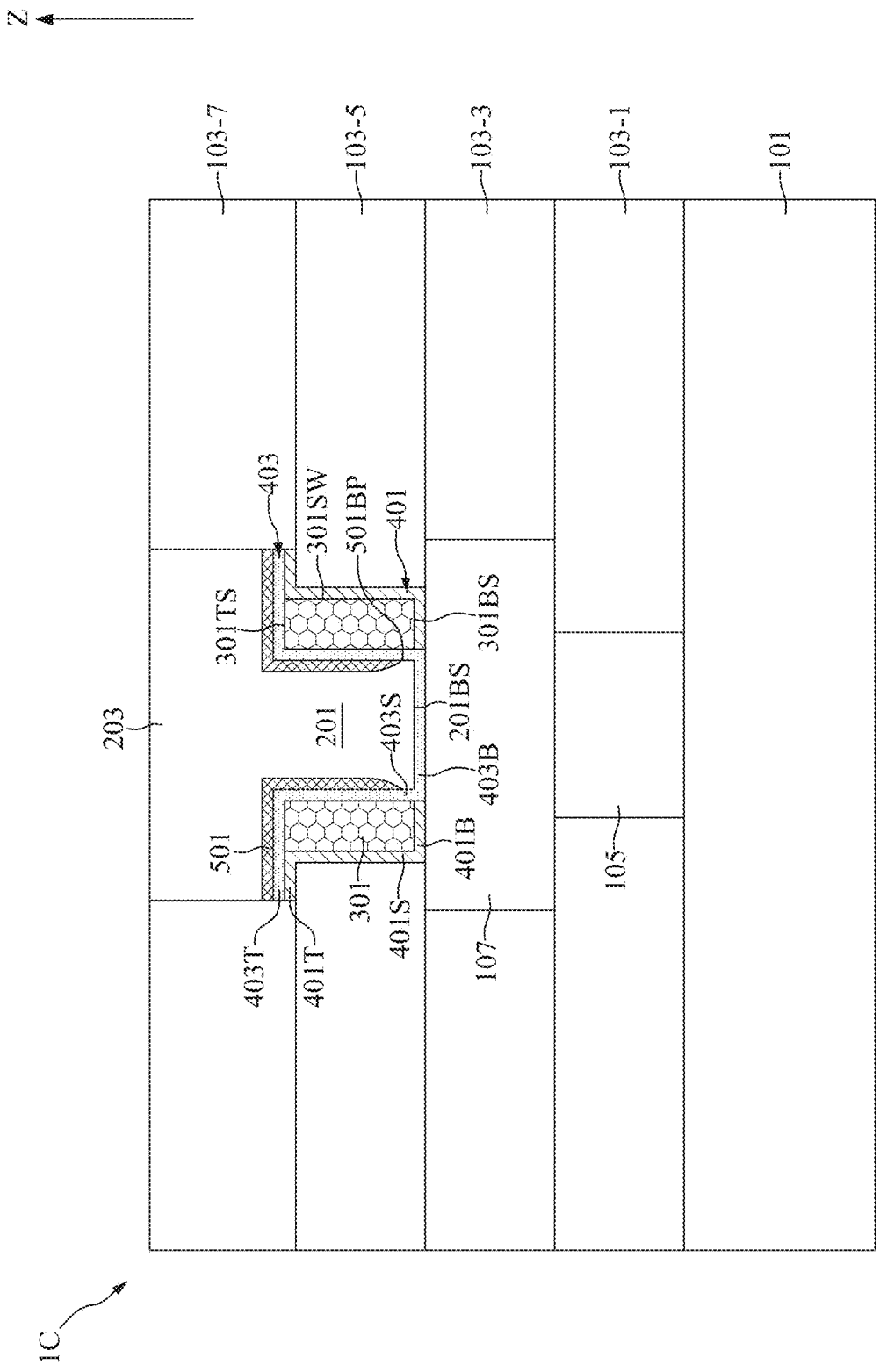

With reference to FIG. 3, the semiconductor device 1C may have a structure similar to that illustrated in FIG. 1. The same or similar elements in FIG. 3 as in FIG. 1 have been marked with similar reference numbers and duplicative descriptions have been omitted.

With reference to FIG. 3, the bottom portion 401B of the first framework layer 401 may be disposed between the bottom conductive layer 107 and the porous insulating layers 301 and between the top contact 201 and the bottom conductive layer 107. The bottom portion 403B of the second framework layer 403 may be disposed on the bottom portion 401B of the first framework layers 401 and disposed between the porous insulating layers 301. In other words, the bottom portion 403B of the second framework layer 403 may be disposed between the top contact 201 and the bottom portion 401B of the first framework layers 401. The bottommost points 501BP of the covering layers 501 may be at a vertical higher than the bottom portion 403B of the second framework layer 403.

Figure 4:
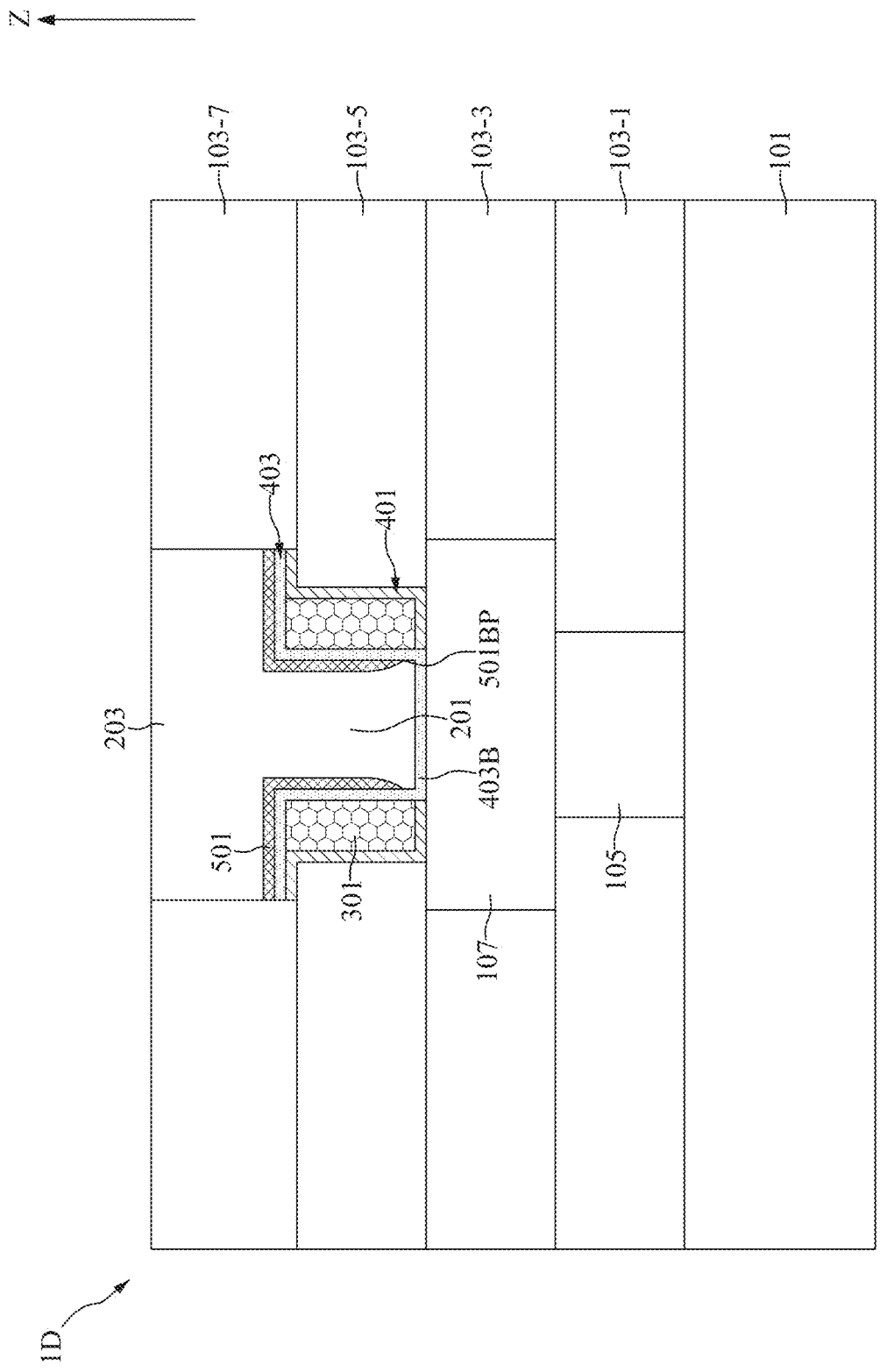

With reference to FIG. 4, the semiconductor device 1D may have a structure similar to that illustrated in FIG. 3. The same or similar elements in FIG. 4 as in FIG. 3 have been marked with similar reference numbers and duplicative descriptions have been omitted.

With reference to FIG. 4, the bottommost points 501BP of the covering layers 501 may contact the bottom portion 403B of the second framework layer 403. It should be noted that most of the bottom portion 403B of the second framework layer 403 is not covered by the covering layers 501.

Figure 5:
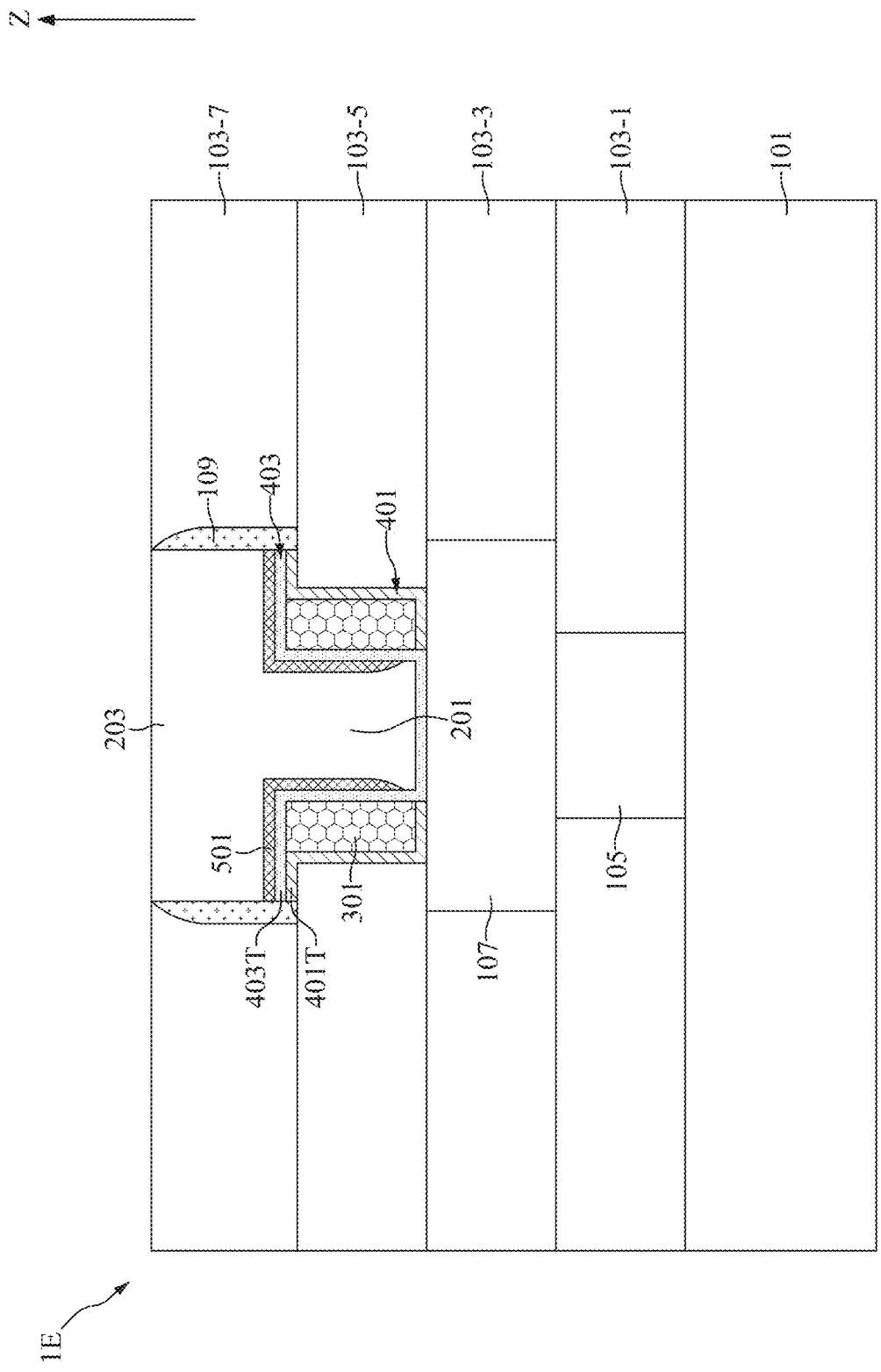

With reference to FIG. 5, the semiconductor device 1E may have a structure similar to that illustrated in FIG. 1. The same or similar elements in FIG. 5 as in FIG. 1 have been marked with similar reference numbers and duplicative descriptions have been omitted.

With reference to FIG. 5, planes consisting of the sidewalls of the top conductive layer 203, the sidewalls of the covering layers 501, the sidewalls of the top portions 403T of the second framework layer 403, the sidewalls of the top portions 401T of the first framework layers 401 are substantially vertical. Spacers 109 may be disposed on the planes aforementioned. The spacers 109 may be formed of, for example, silicon oxide, silicon nitride, silicon carbon nitride, silicon nitride oxide, or silicon oxynitride. The spacers 109 may electrically isolate the top conductive layer 203, the first framework layers 401, the second framework layer 403, and the covering layers 501 from neighboring conductive elements (not shown in FIG. 5 for clarity) in the first insulating layer 103-7.

It should be noted that, in the description of the present disclosure, a surface (or sidewall) is "vertical" if there exists a vertical plane from which the surface does not deviate by more than three times the root mean square roughness of the surface.

Figure 6:
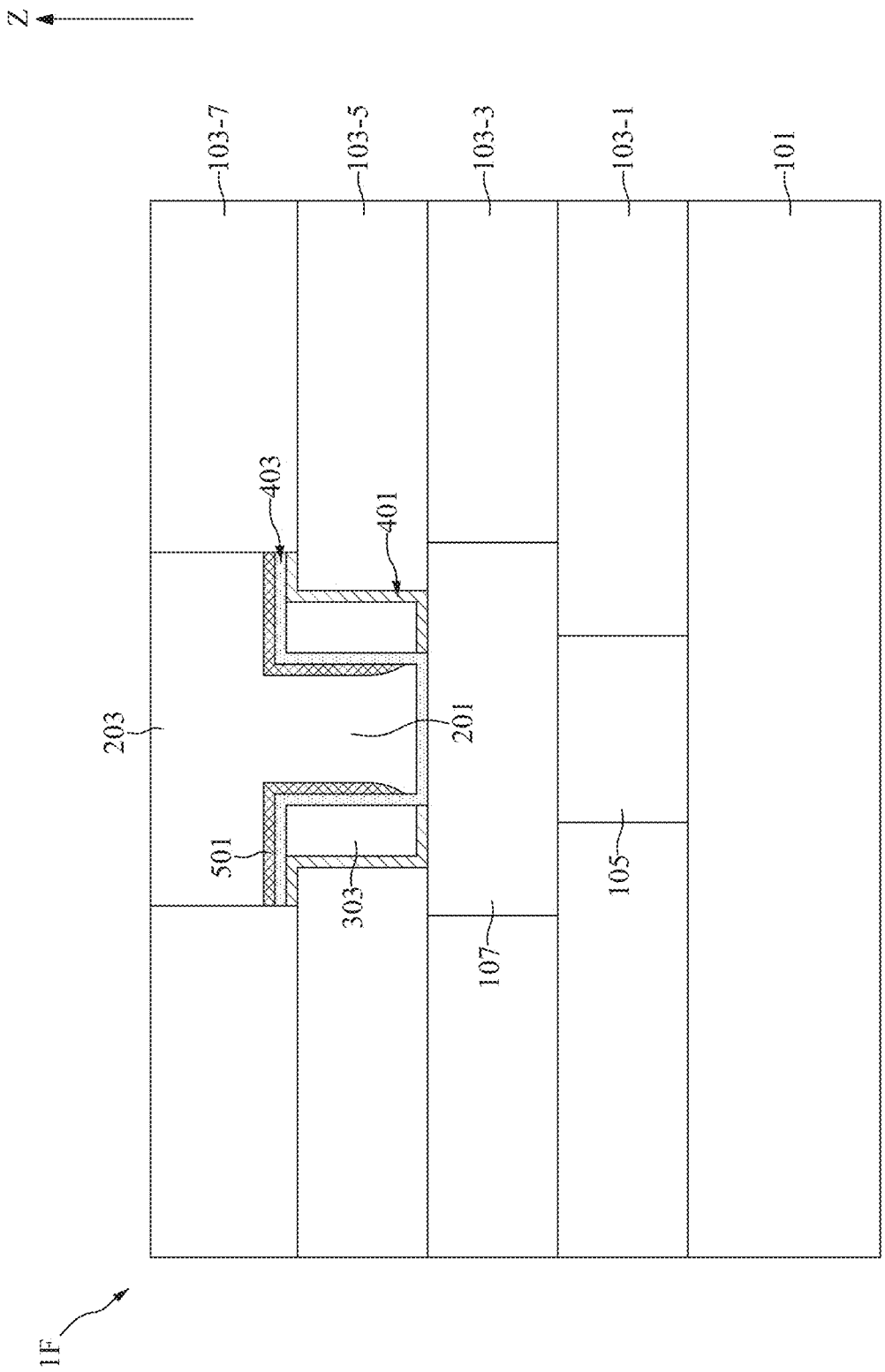

With reference to FIG. 6, the semiconductor device 1F may have a structure similar to that illustrated in FIG. 1. The same or similar elements in FIG. 6 as in FIG. 1 have been marked with similar reference numbers and duplicative descriptions have been omitted.

With reference to FIG. 6, the porosities of the porous insulating layers 301 may be 100% which means the porous insulating layers 301 includes only empty spaces and the porous insulating layers 301 may be regarded as air gaps 303. The dielectric constant of the air gaps 303 are 1.0 which may significantly reduce the parasitic capacitance between the top contact 201 and horizontally neighboring conductive elements (not shown in FIG. 6 for clarity).

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 7:
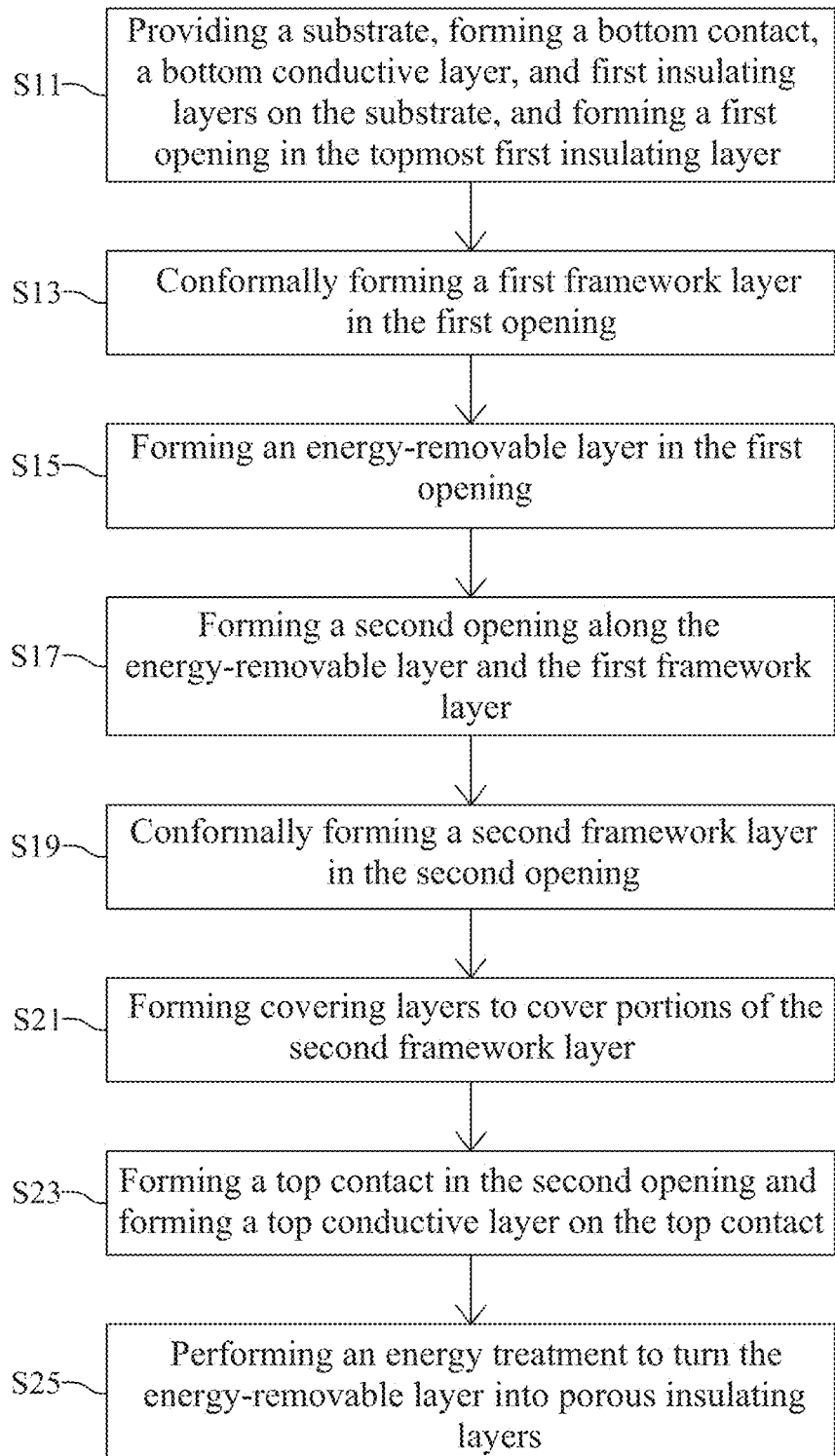
FIG. 7 illustrates, in a flowchart diagram form, a method for fabricating a semiconductor device in accordance with one embodiment of the present disclosure.

FIG. 7 illustrates, in a flowchart diagram form, a method 10 for fabricating a semiconductor device 1A in accordance with one embodiment of the present disclosure. FIGS. 8 to 19 illustrate, in schematic cross-sectional view diagrams, a flow for fabricating the semiconductor device 1A in accordance with one embodiment of the present disclosure.

Figure 8:
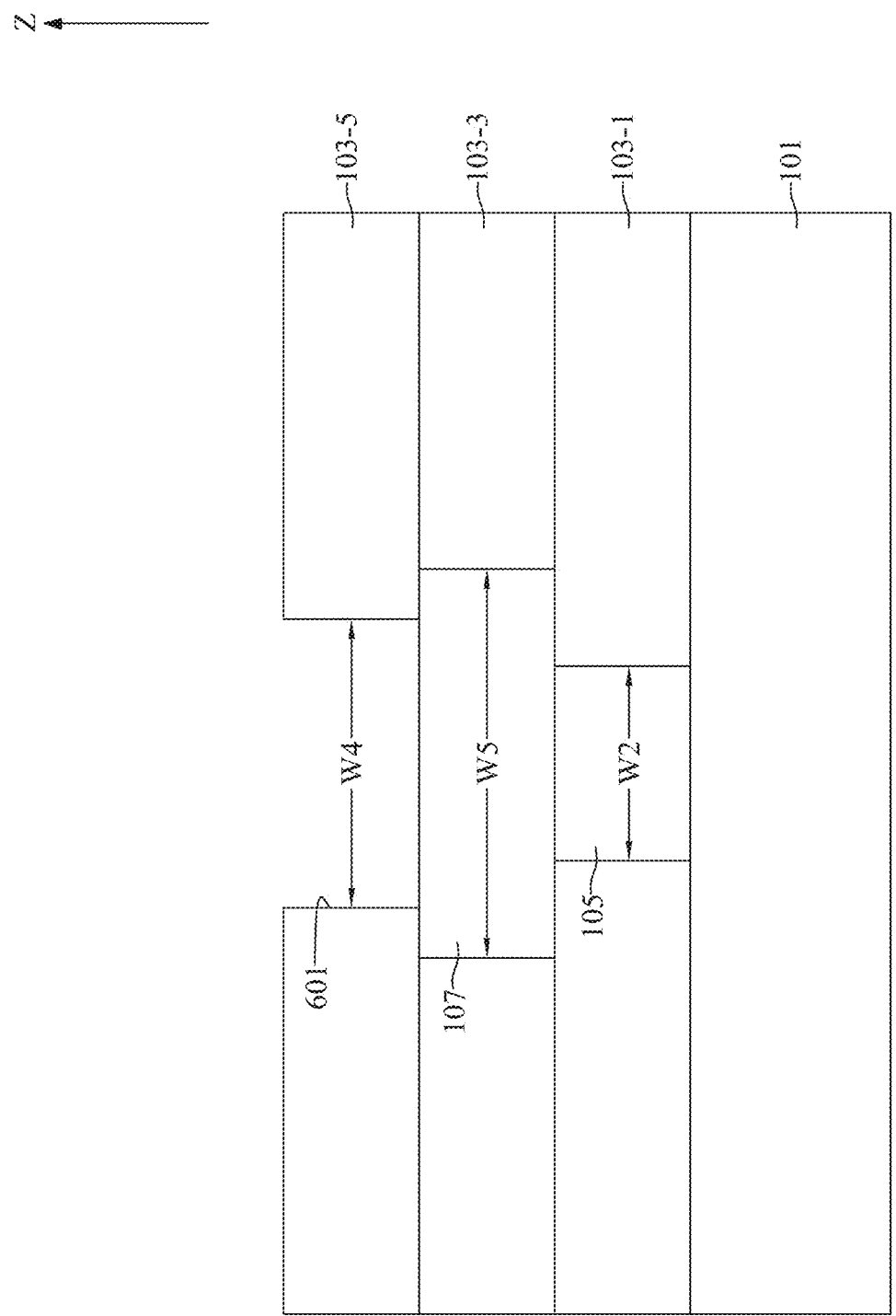
FIGS. 8 to 19 illustrate, in schematic cross-sectional view diagrams, a flow for fabricating the semiconductor device in accordance with one embodiment of the present disclosure.

With reference to FIGS. 7 and 8, at step S11, a substrate 101 may be provided, a bottom contact 105, a bottom conductive layer 107, and first insulating layers 103-1, 103-3, 103-5 may be formed on the substrate 101, and a first opening 601 may be formed in the first insulating layer 103-5.

With reference to FIG. 8, the substrate 101 may include a semiconductor-on-insulator structure. In some embodiments, the semiconductor-on-insulator structure may be formed by wafer bonding. In some embodiments, the semiconductor-on-insulator structure may be formed by an implantation process such as separation by implanting oxygen. In some embodiments, a thermal mixing process or a thermal condensation process may be employed in forming the topmost semiconductor material layer of the semiconductor-on-insulator structure. The thermal mixing process may include annealing in an inert ambient (i.e., helium and/or argon), while the thermal condensation process may include annealing in an oxidizing ambient (air, oxygen, ozone and/or $NO_2$). The anneal temperature for both the thermal mixing process and the thermal condensation process may be between about 600° C. and about 1200° C.

The first insulating layers 103-1, 103-3, 103-5 may be formed by deposition processes such as chemical vapor deposition, plasma enhanced chemical vapor deposition, evaporation, or spin-on coating. Planarization processes may be respectively correspondingly performed after the deposition processes to remove excess material and provide a substantially flat surface for subsequent processing steps. The bottom contact 105 and the bottom conductive layer 107 may be formed during the formation of the first insulating layers 103-1, 103-3.

The first opening 601 may be formed in the first insulating layer 103-5. A portion of the bottom conductive layer 107 may be exposed through the first opening 601. In a cross-sectional perspective, a width W4 of the first opening 601 may be equal to or greater than the width W2 of the bottom contact 105. The width W4 of the first opening 601 may be less than a width W5 of the bottom conductive layer 107.

Figure 9:
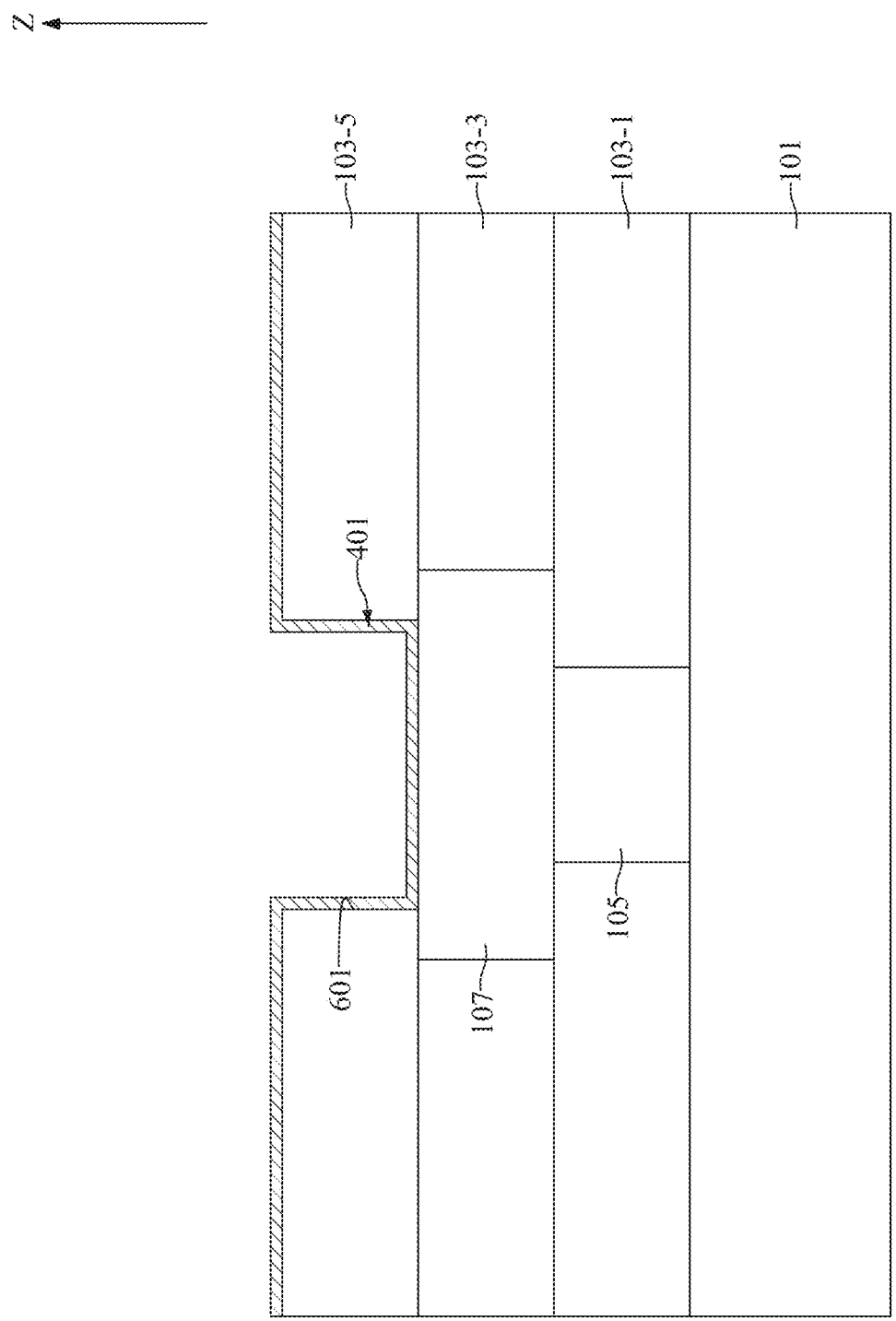

With reference to FIGS. 7 and 9, at step S13, a first framework layer 401 may be conformally formed in the first opening 601.

With reference to FIG. 9, the first framework layer 401 may be conformally formed on the top surface of the first insulating layer 103-5 and in the first opening 601. In some embodiments, the first framework layer 401 may be formed of, for example, a material including $sp^2$ hybridized carbon atoms. In some embodiments, the first framework layer 401 may be formed of, for example, a material including carbons having hexagonal crystal structures. In some embodiments, the first framework layer 401 may be formed of, for example, graphene, graphite, or the like.

In some embodiments, the first framework layer 401 may be formed on a catalyst substrate and then transfer onto the intermediate semiconductor device illustrated in FIG. 8. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, a catalytic conductive layer (not shown for clarity) may be conformally formed on the top surface of the first insulating layer 103-5 and in the first opening 601. The first framework layer 401 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the first framework layer 401 may be formed with assistances of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

Figure 10:
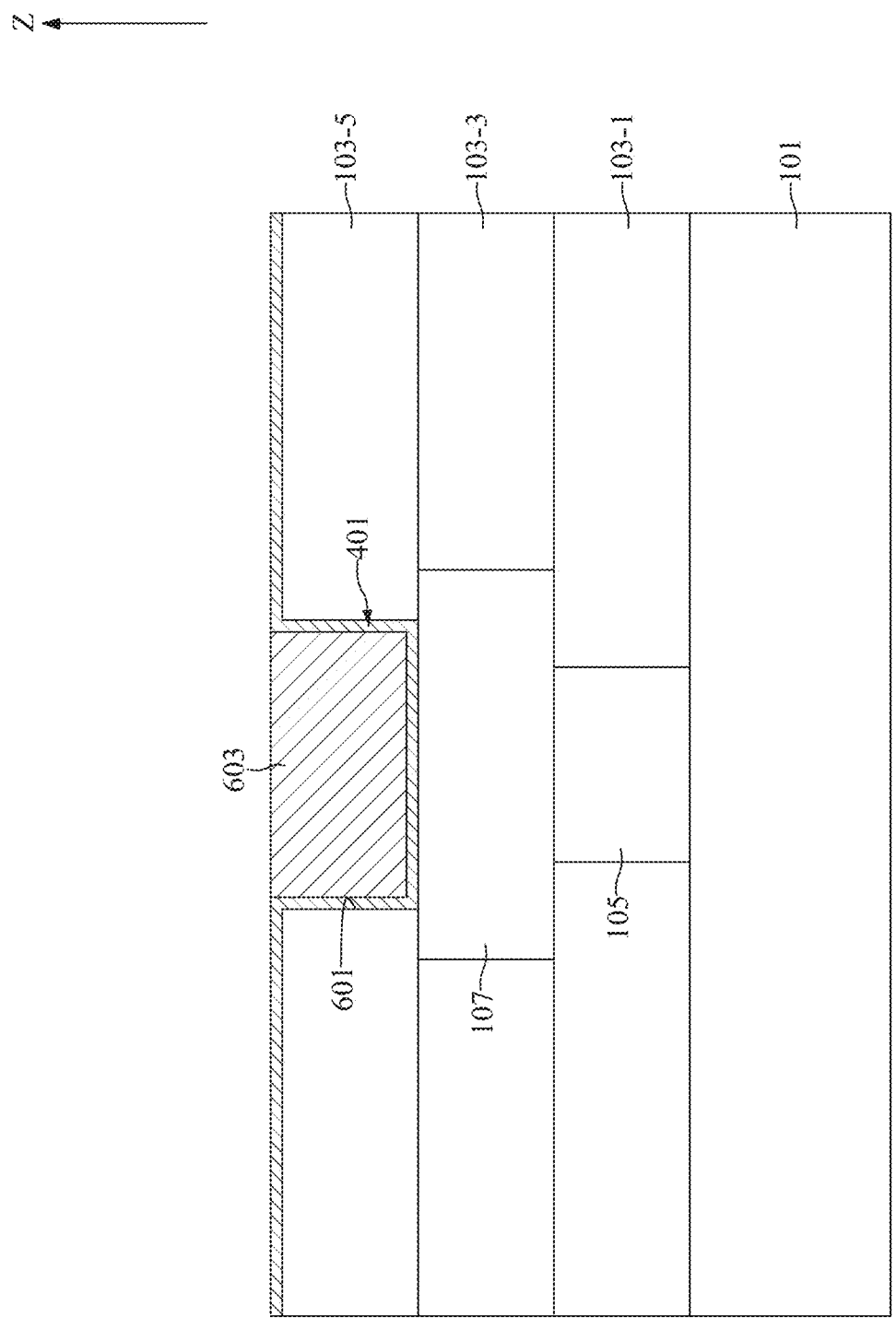

With reference to FIGS. 7 and 10, at step S15, an energy-removable layer 603 may be formed in the first opening 601.

With reference to FIG. 10, the energy-removable layer 603 may be formed over the intermediate semiconductor device illustrated in FIG. 9 to fill the first opening 601. A planarization process, such as chemical mechanical polishing or etch back process, may be performed until the top surface of the first insulating layer 103-5 is exposed to remove excess material and provide a substantially flat surface for subsequent processing steps. The energy-removable layer 603 may include a material such as a thermal-decomposable material, a photonic-decomposable material, an e-beam decomposable material, or a combination thereof.

For example, the energy-removable layer 603 may include a base material and a decomposable porogen material that is sacrificially removed upon exposure to an energy source. The base material may include a methylsilsesquioxane based material, low-dielectric material, or silicon oxide. The decomposable porogen material may include a porogen organic compound that provides porosity to the base material of the energy-removable material. In some embodiments, the energy-removable layer 603 may include about 95% or greater of the decomposable porogen material, and about 5% or less of the base material. In some embodiments, the energy-removable layer 603 may include about 30% or greater of the decomposable porogen material, and about 70% or less of the base material.

Figure 11:
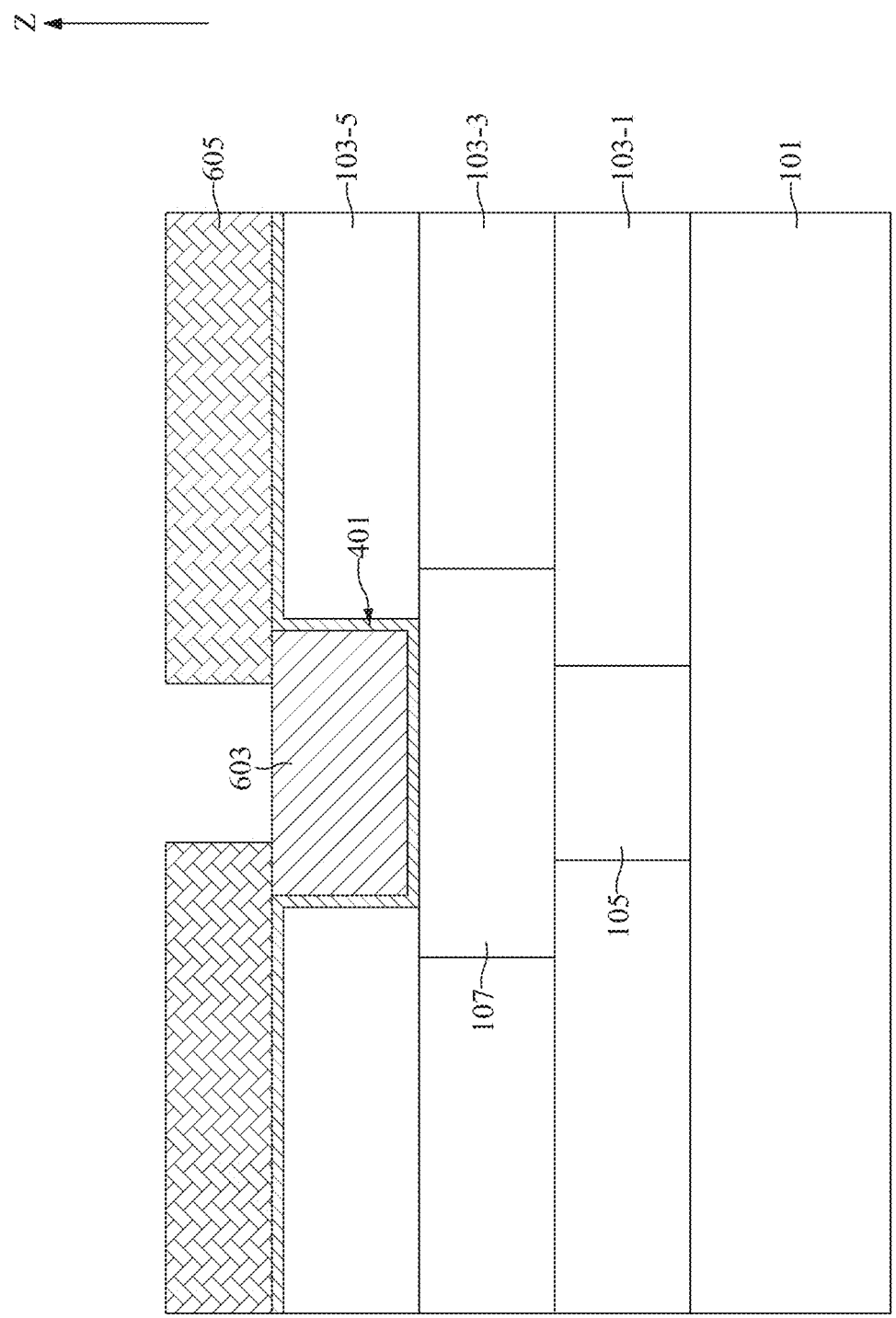
Figure 12:
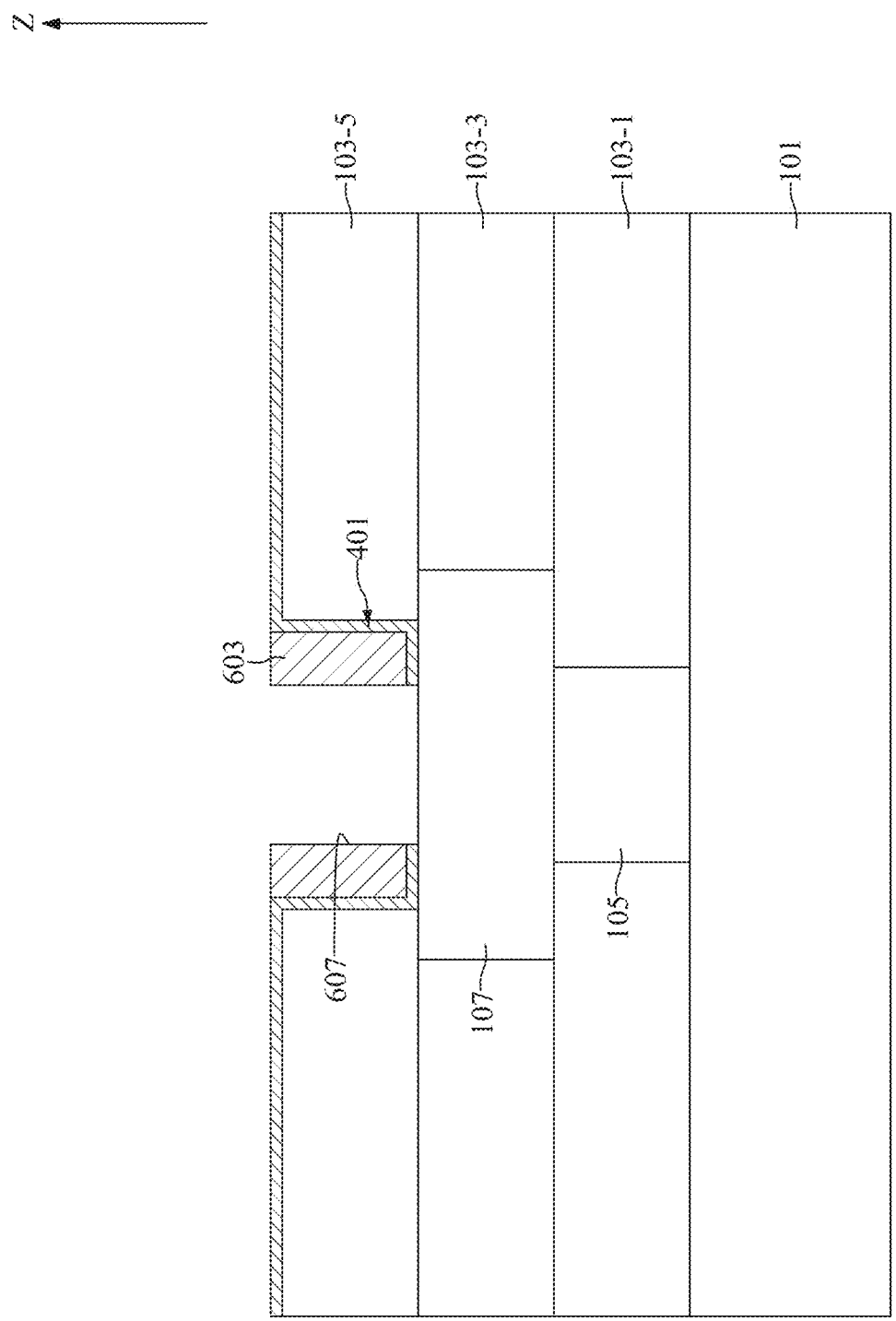

With reference to FIGS. 7, 11, and 12, at step S17, a second opening 607 may be formed along the energy-removable layer 603 and the first framework layer 401.

With reference to FIG. 11, a first mask layer 605 may be formed on the intermediate semiconductor device illustrated in FIG. 10 and define the position of the second opening 607. In some embodiments, the first mask layer 605 may be a photoresist layer. In some embodiments, the first mask layer 605 may be a stacked layered structure including a hard mask layer, an anti-reflective coating layer, and a photoresist layer.

With reference to FIG. 12, an etch process, such as an anisotropic dry etch process, may be performed to remove a portion of the energy-removable layer 603 and a portion of the first framework layer 401. The etch process may be a single step etch process or a multi-step etch process. After the etch process, the top surface of the bottom conductive layer 107 may be exposed. The first framework layers 401 may be divided into two segments by the etch process. The energy-removable layer 603 may be divided into two segments by the etch process.

Figure 13:
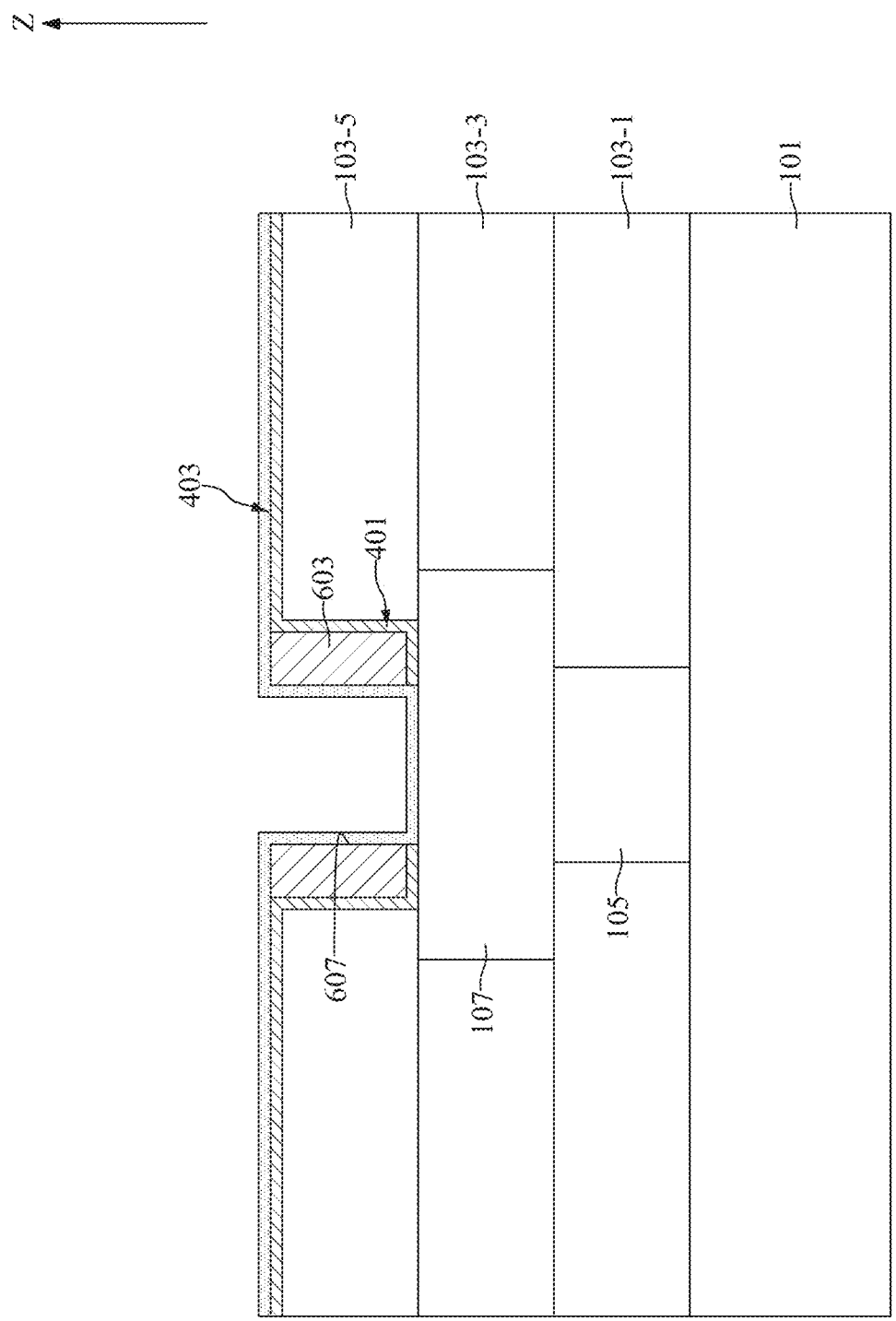

With reference to FIGS. 7 and 13, at step S19, a second framework layer 403 may be formed in the second opening 607.

With reference to FIG. 13, the second framework layer 403 may be conformally formed on the first framework layer 401, on the energy-removable layer 603, and in the second opening 607. The first framework layer 401 and the second framework layer 403 may enclose the energy-removable layer 603. The first framework layer 401 and the second framework layer 403 may provide additional structural supporting to the energy-removable layer 603.

In some embodiments, the second framework layer 403 may be formed of a same material as the first framework layer 401. In some embodiments, the second framework layer 403 may be formed of different materials from the first framework layer 401. For example, the second framework layer 403 may be formed of a material including $sp^2$ hybridized carbon atoms. For another example, the second framework layer 403 may be formed of a material including carbons having hexagonal crystal structures. For yet another example, the second framework layer 403 may be formed of, for example, graphene, graphite, or the like.

In some embodiments, the second framework layer 403 may be formed on a catalyst substrate and then transfer onto the intermediate semiconductor device illustrated in FIG. 12. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, a catalytic conductive layer (not shown for clarity) may be conformally formed on the first framework layer 401, on the energy-removable layer 603, and in the second opening 607. The second framework layer 403 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the second framework layer 403 may be formed with assistances of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

Figure 14:
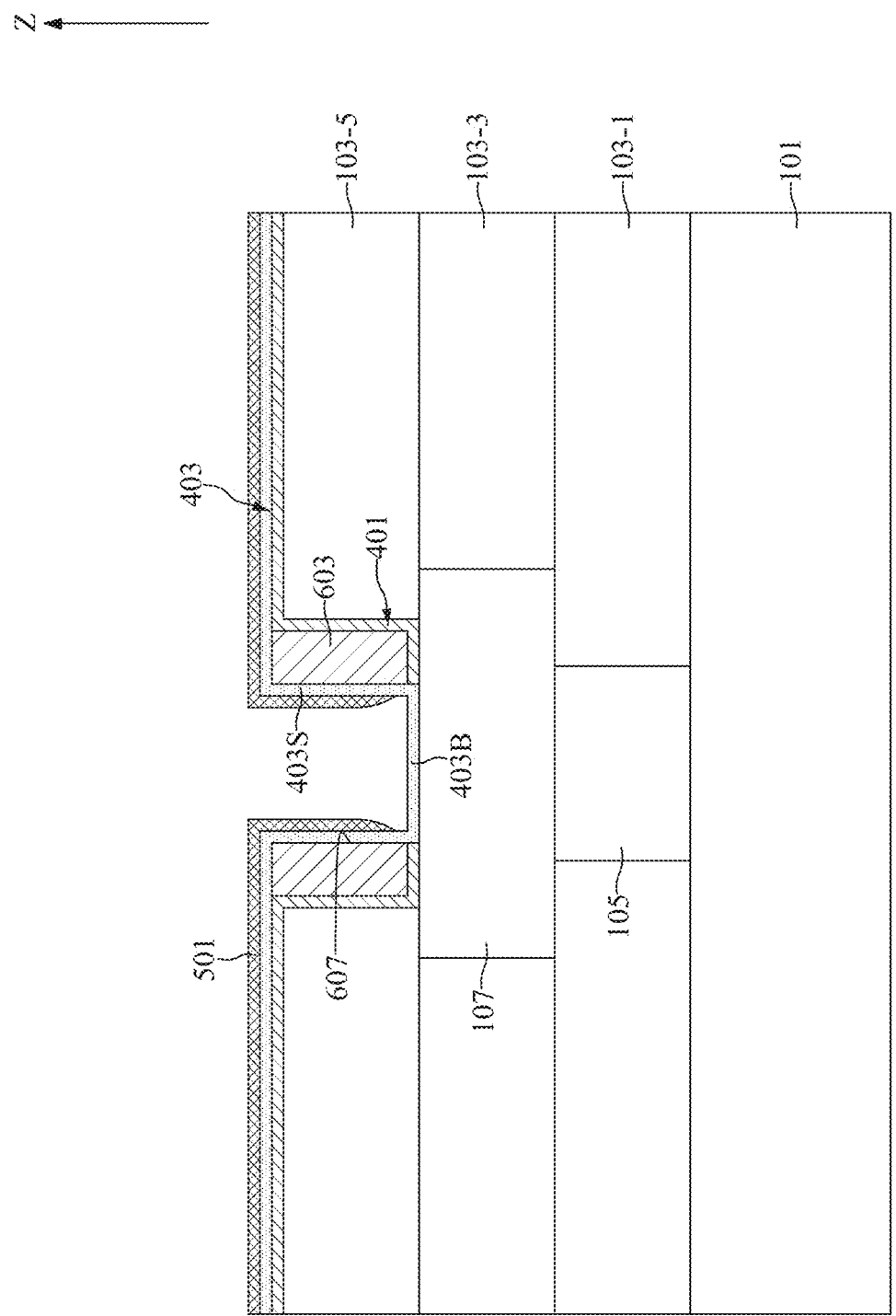

With reference to FIGS. 7 and 14, at step S21, covering layers 501 may be formed to cover portions of the second framework layer 403.

With reference to FIG. 14, in some embodiments, the covering layers 501 may be formed of any suitable metal, metal oxide, metal carbide, metal nitride, or combination thereof. For example, the covering layers 501 may be formed of aluminum carbide, aluminum nitride, tungsten carbide, or tungsten nitride. The covering layers 501 may be formed by conformally deposited a metal on the second framework layer 403 and in the second opening 607. Due to the geometry of the second opening 607 may prevent the metal from reaching the bottom surfaces of the second opening 607. Thus, the metal may deposit faster on the side portions 403S than on the bottom portion 403B. Subsequently, a plasma treatment using a nitrogen-containing or carbon-containing gas may be applied to transform the metal into a metal nitride or a metal carbide.

In some embodiments, the covering layers 501 may be conformally formed on the side portions 403S and the bottom portion 403B. An anisotropic etching process may be applied to remove the covering layers 501 formed on the bottom portion 403B.

In some embodiments, the covering layers 501 may be formed by a deposition process such as an atomic layer deposition method precisely controlling an amount of a first precursor of the atomic layer deposition method. The covering layers 501 may be formed of, for example, aluminum oxide, hafnium oxide, zirconium oxide, titanium oxide, titanium nitride, tungsten nitride, silicon nitride, or silicon oxide.

In some embodiments, when the covering layers 501 are formed of aluminum oxide, the first precursor of the atomic layer deposition method may be trimethylaluminum and a second precursor of the atomic layer deposition method may be water or ozone.

In some embodiments, when the covering layers 501 are formed of hafnium oxide, the first precursor of the atomic layer deposition method may be hafnium tetrachloride, hafnium tert-butoxide, hafnium dimethylamide, hafnium ethylmethylamide, hafnium diethylamide, or hafnium methoxy-t-butoxide and the second precursor of the atomic layer deposition method may be water or ozone.

In some embodiments, when the covering layers 501 are formed of zirconium oxide, the first precursor of the atomic layer deposition method may be zirconium tetrachloride and the second precursor of the atomic layer deposition method may be water or ozone.

In some embodiments, when the covering layers 501 are formed of titanium oxide, the first precursor of the atomic layer deposition method may be titanium tetrachloride, tetraethyl titanate, or titanium isopropoxide and the second precursor of the atomic layer deposition method may be water or ozone.

In some embodiments, when the covering layers 501 are formed of titanium nitride, the first precursor of the atomic layer deposition method may be titanium tetrachloride and ammonia.

In some embodiments, when the covering layers 501 are formed of tungsten nitride, the first precursor of the atomic layer deposition method may be tungsten hexafluoride and ammonia.

In some embodiments, when the covering layers 501 are formed of silicon nitride, the first precursor of the atomic layer deposition method may be silylene, chlorine, ammonia, and/or dinitrogen tetrahydride.

In some embodiments, when the covering layers 501 are formed of silicon oxide, the first precursor of the atomic layer deposition method may be silicon tetraisocyanate or $CH_3OSi(NCO)_3$ and the second precursor of the atomic layer deposition method may be hydrogen or ozone.

With reference to FIG. 7 and FIGS. 15 to 18, at step S23, a top contact 201 may be formed in the second opening 607 and a top conductive layer 203 may be formed on the top contact 201.

Figure 15:
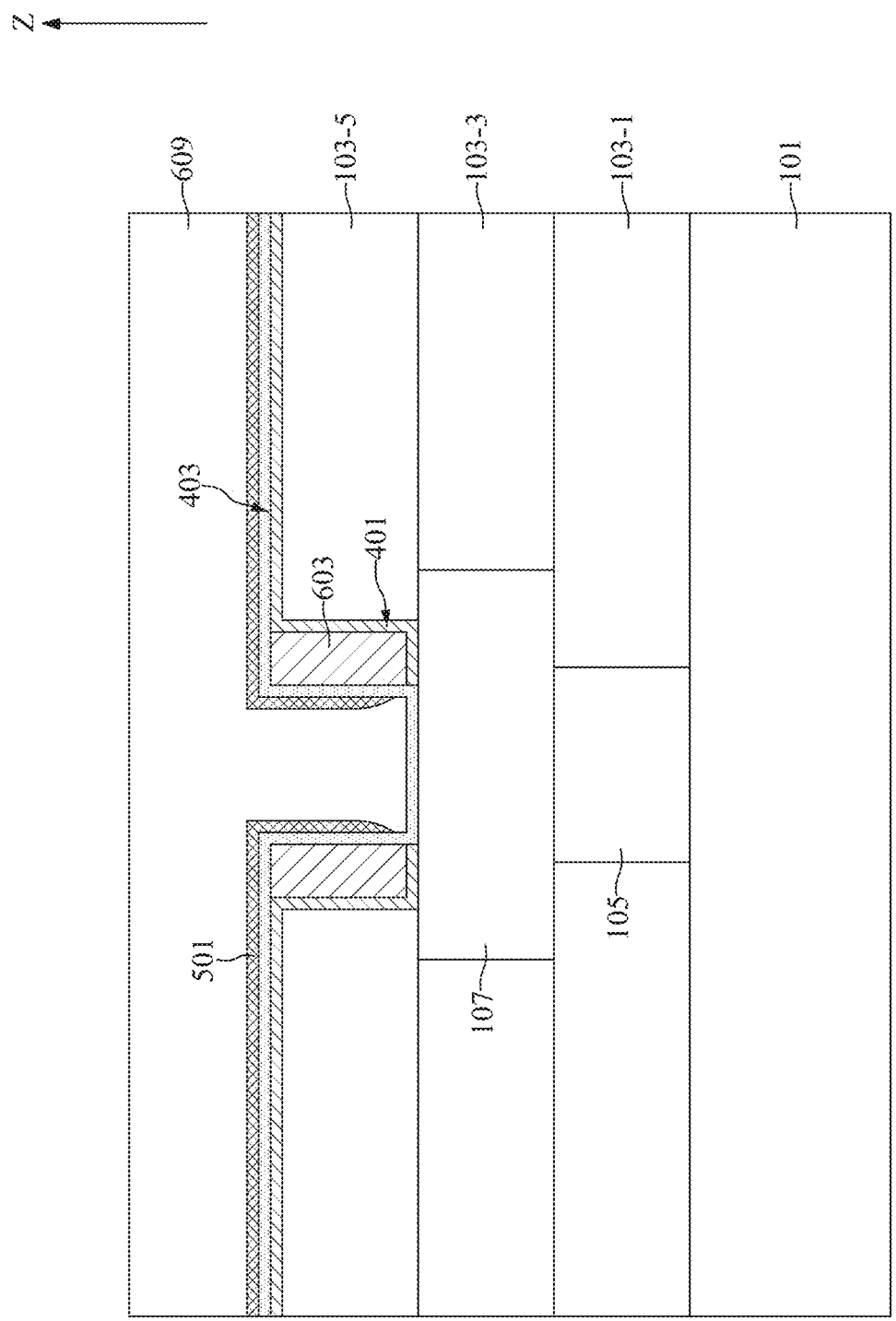

With reference to FIG. 15, a layer of first conductive material 609 may be deposited over the intermediate semiconductor device illustrated in FIG. 14 to completely fill the second opening 607 and cover the covering layers 501. The first conductive material 609 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The layer of first conductive material 609 may be deposited by atomic layer deposition, chemical vapor deposition, or other conformal deposition method.

Due to the presence of the covering layers 501, the deposition rate of the layer of first conductive material 609 on the sidewalls of the second opening 607 may be reduced. Hence, the deposition rate of the first conductive material 609 on the sidewalls of the second opening 607 and the deposition rate of the first conductive material 609 on the bottom surface of the second opening 607 may become close to each other. As a result, the second opening 607 may be filled without any void formation near the bottom surface of the second opening 607. A planarization process, such as chemical mechanical polishing, may be performed to provide a substantially flat surface for subsequent processing steps.

Figure 16:
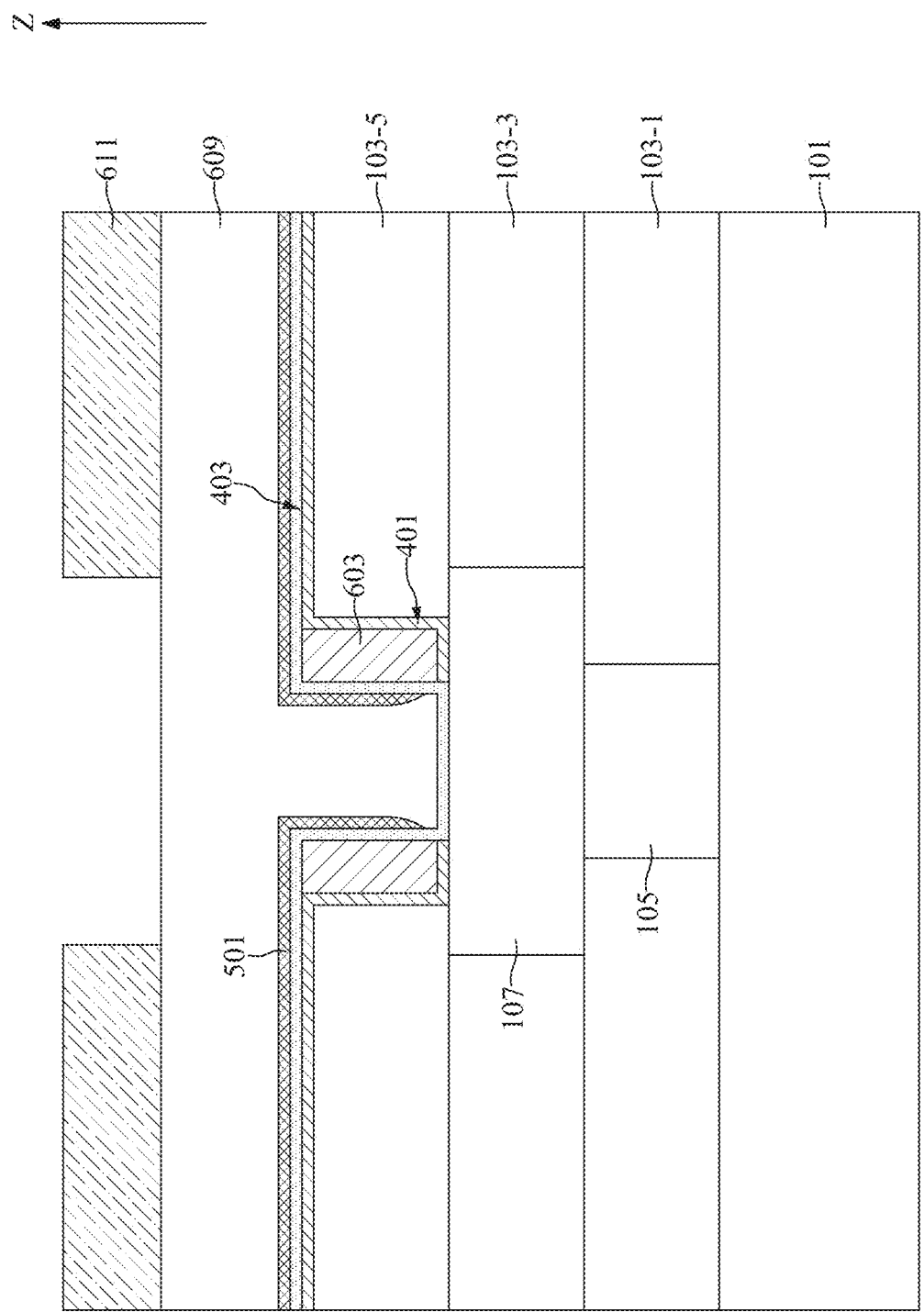

With reference to FIG. 16, a second mask layer 611 may be formed on the layer of first conductive material 609 and define the position of the top conductive layer 203. In some embodiments, the second mask layer 611 may be a photoresist layer. In some embodiments, the second mask layer 611 may be a stacked layered structure including a hard mask layer, an anti-reflective coating layer, and a photoresist layer.

Figure 17:
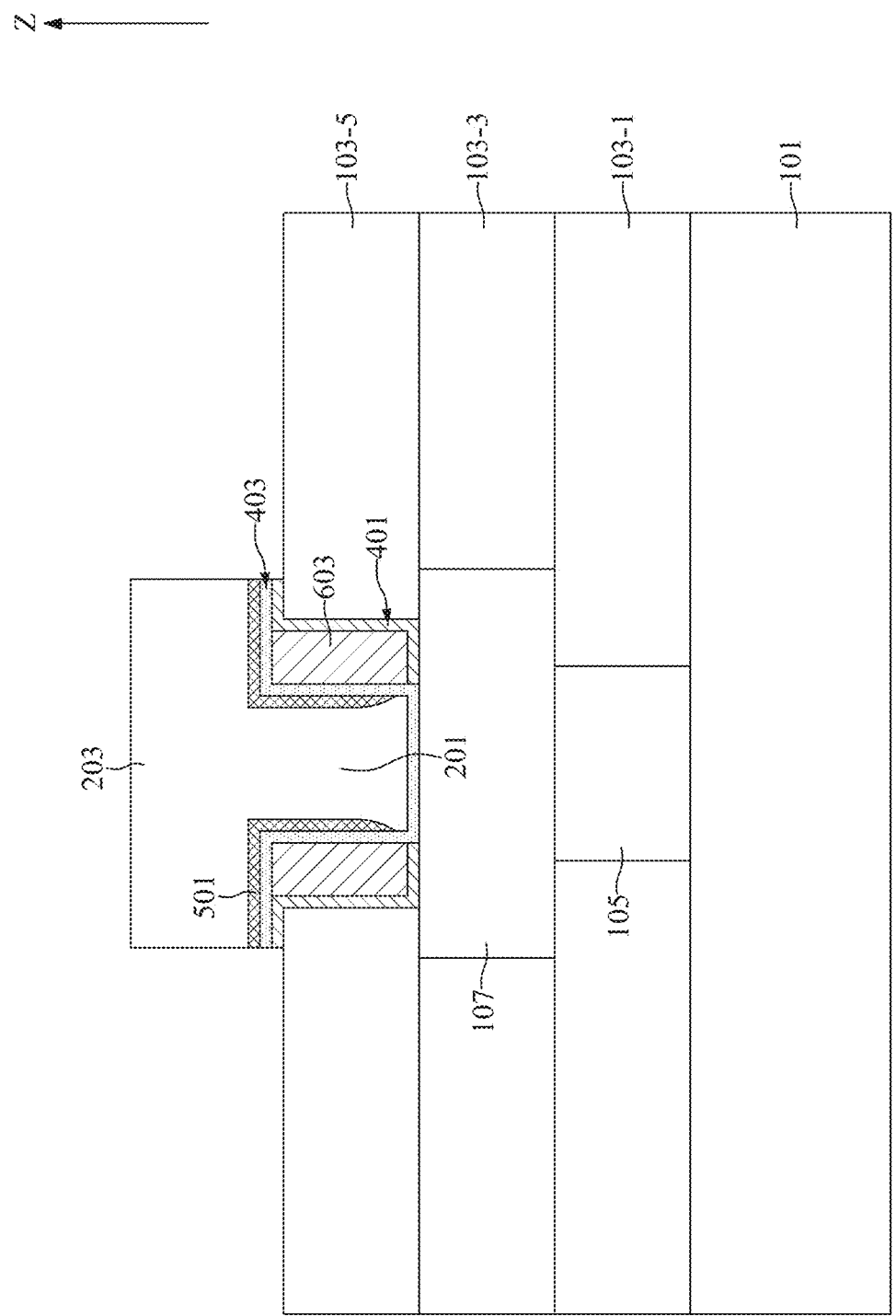

With reference to FIG. 17, an etch process may be performed to remove a portion of the layer of first conductive material 609, portions of the covering layers 501, portions of the second framework layer 403, and portions of the first framework layer 401. After the etch process, the top contact 201 may be formed in the second opening 607 and the top conductive layer 203 may be concurrently formed on the top contact 201.

Figure 18:
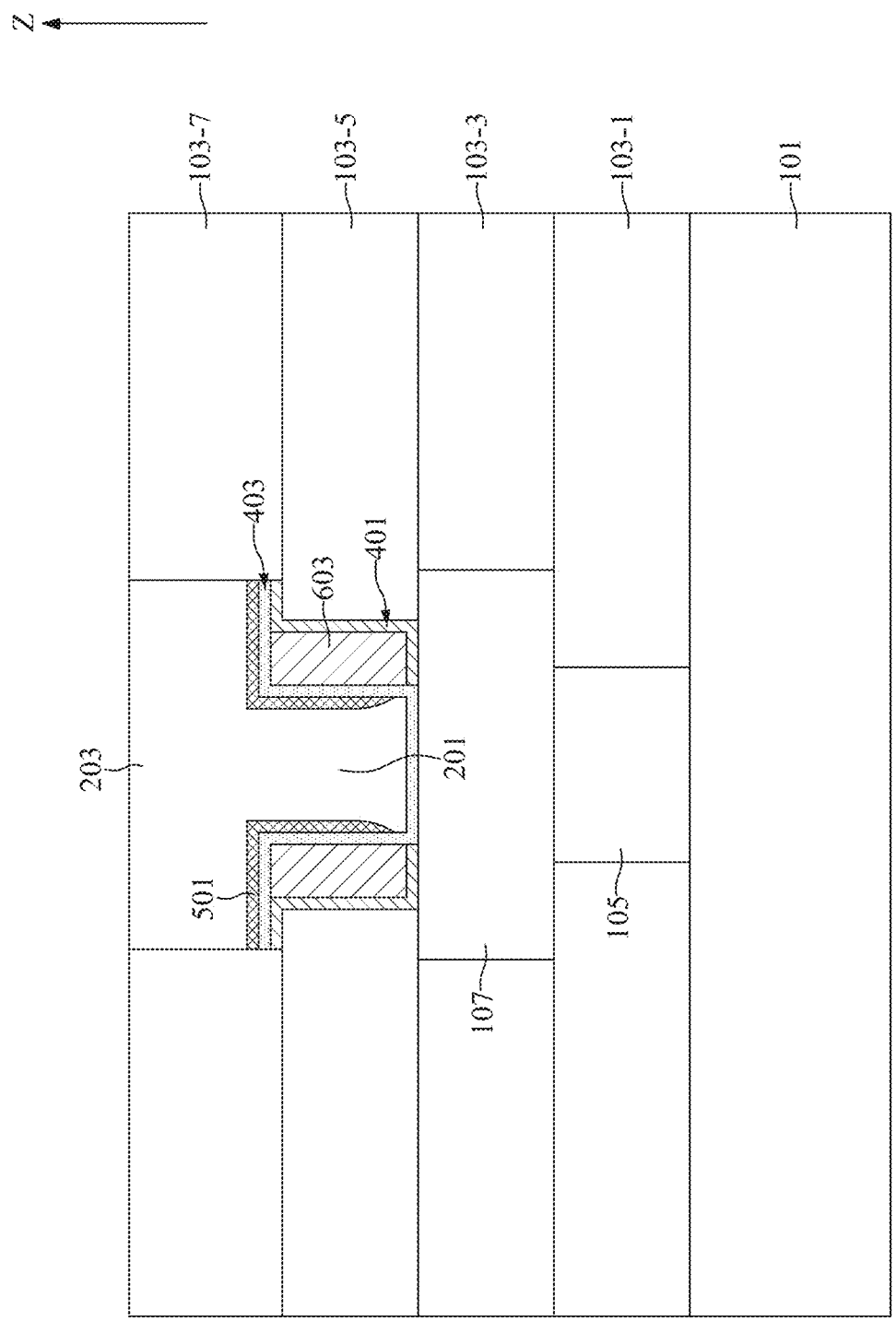

With reference to FIG. 18, a first insulating layer 103-7 may be formed over the intermediate semiconductor device illustrated in FIG. 17 to cover the top conductive layer 203. A planarization process, such as chemical mechanical polishing, may be performed until a top surface of the top conductive layer 203 is exposed to remove excess material and provide a substantially flat surface for subsequent processing steps.

Figure 19:
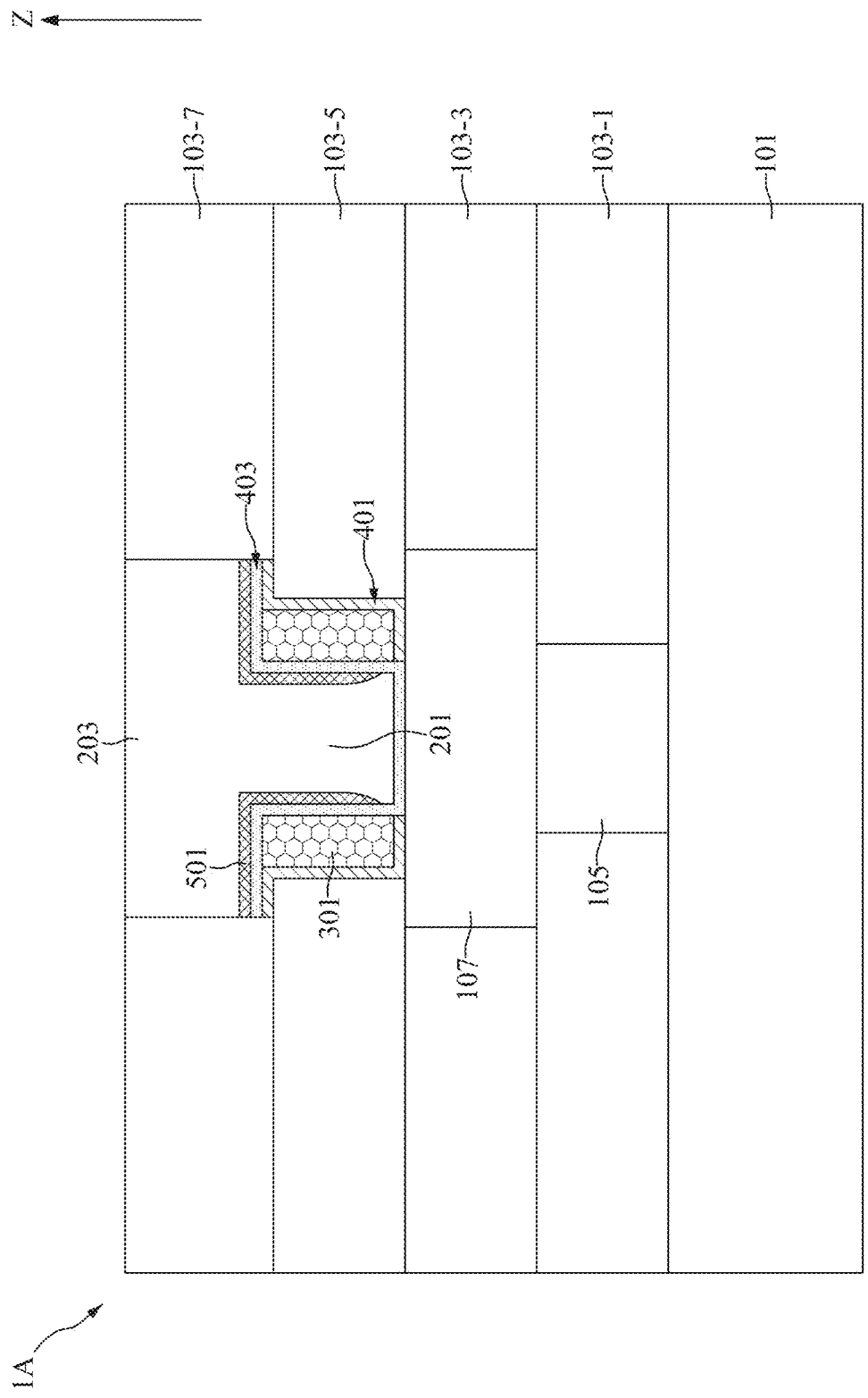

With reference to FIGS. 7 and 19, at step S25, an energy treatment may be performed to transform the energy-removable layer 603 into porous insulating layers 301.

With reference to FIG. 19, the energy treatment process may be performed on the intermediate semiconductor device in FIG. 18 by applying an energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable layer 603 to generate empty spaces (pores), with the base material remaining in place.

Figure 20:
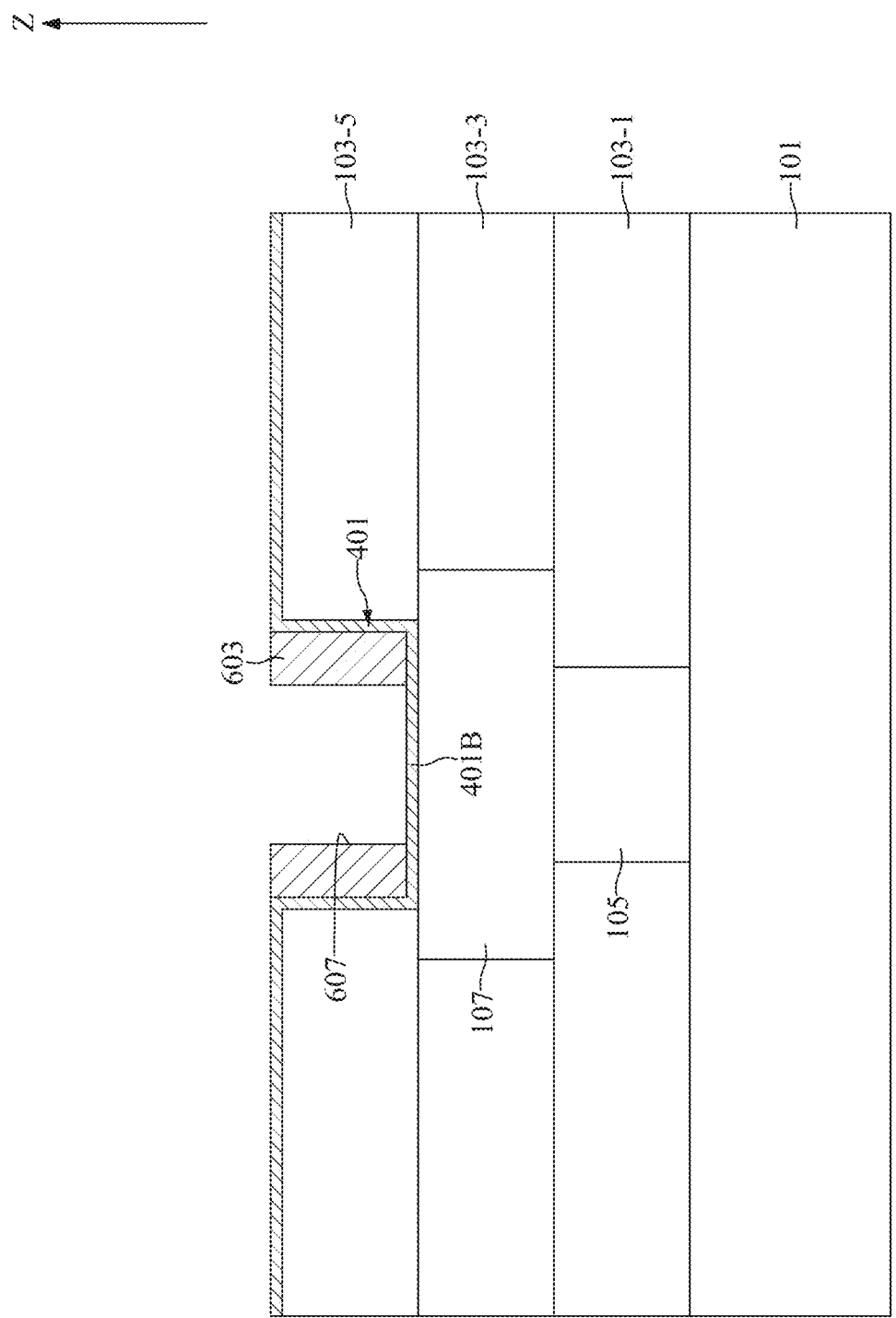
FIGS. 20 to 22 illustrate, in schematic cross-sectional view diagrams, a flow for fabricating a semiconductor device in accordance with another embodiment of the present disclosure.
Figure 21:
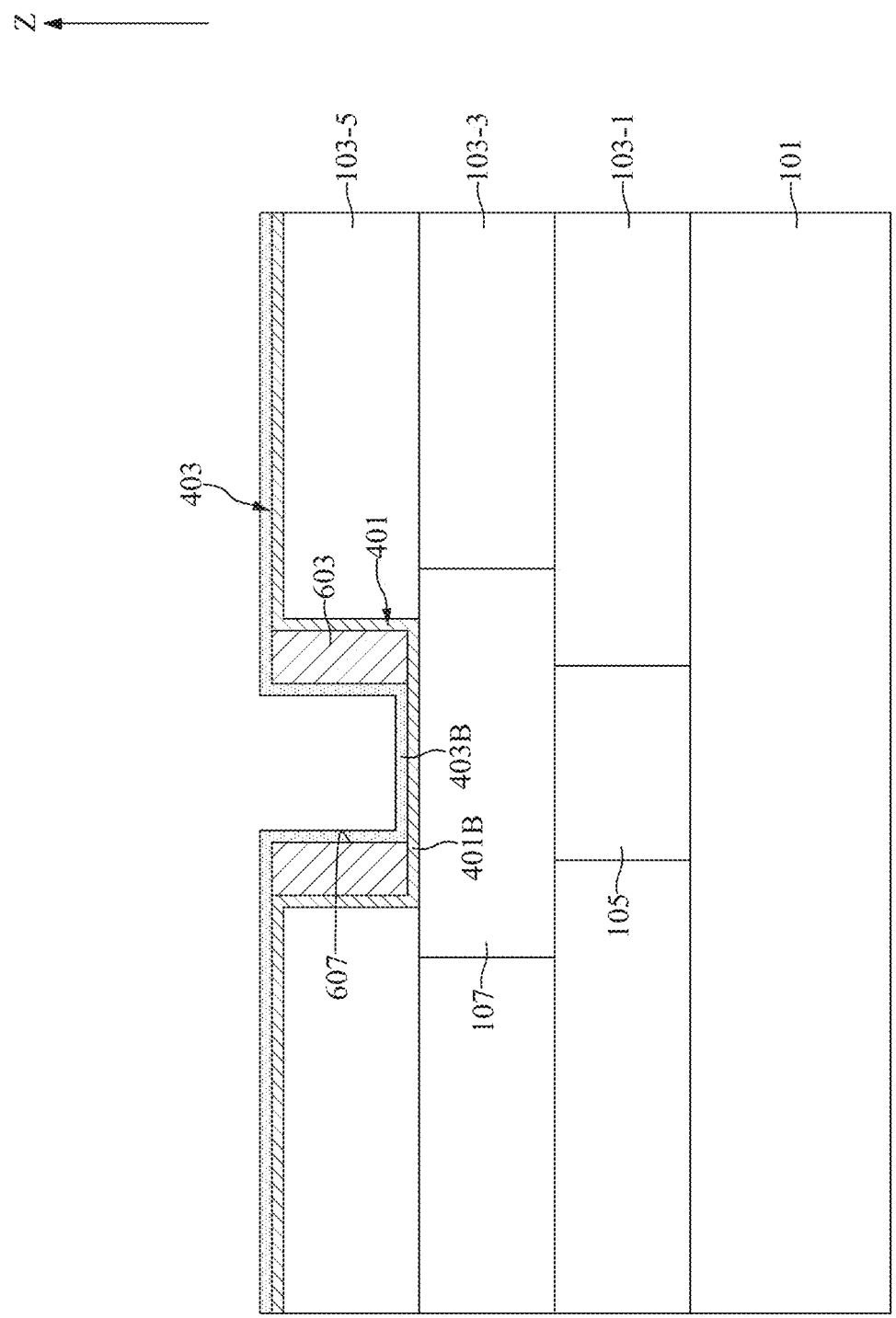
Figure 22:
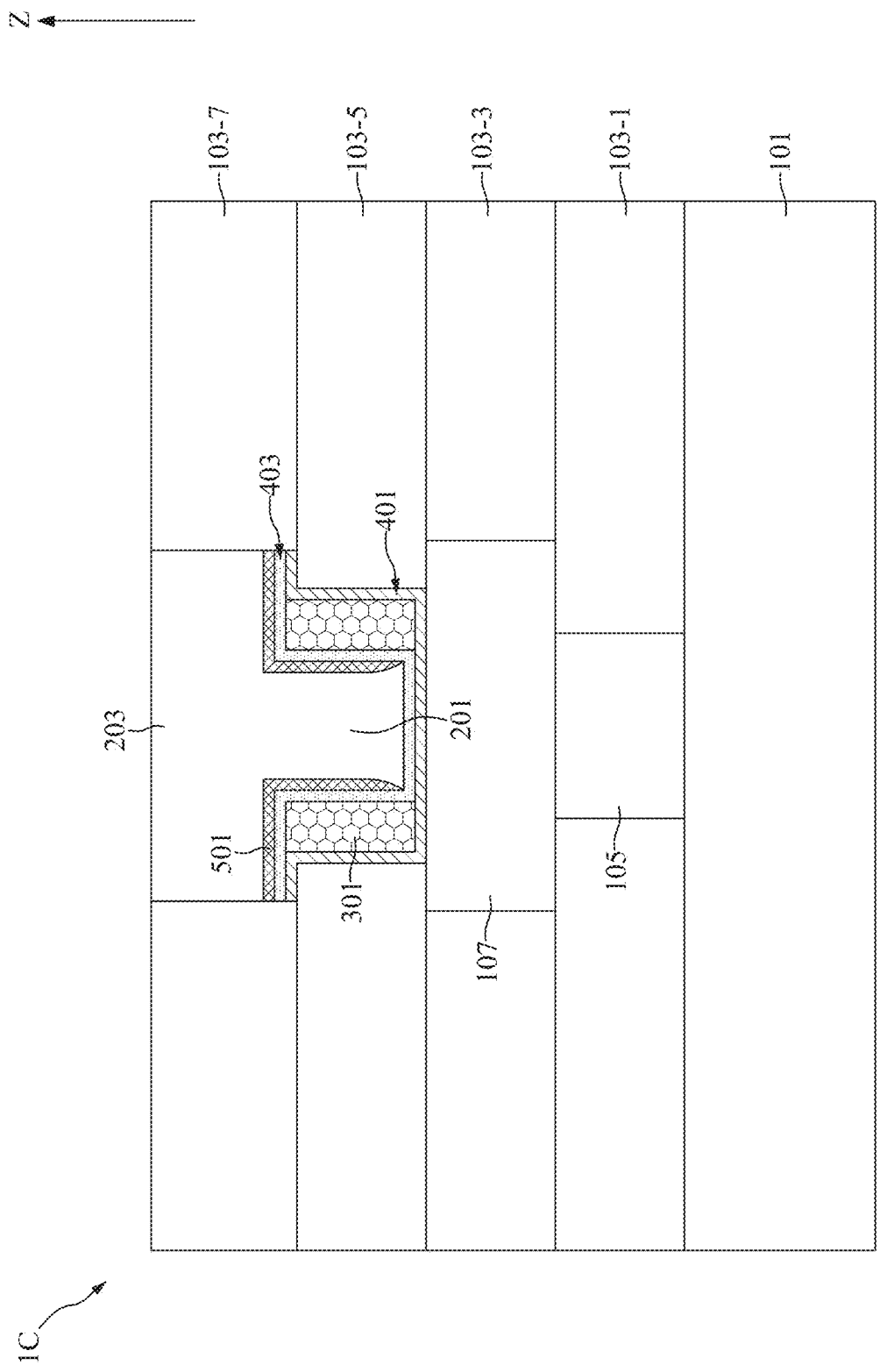

FIGS. 20 to 22 illustrate, in schematic cross-sectional view diagrams, a flow for fabricating a semiconductor device 1C in accordance with another embodiment of the present disclosure.

With reference to FIG. 20, an intermediate semiconductor device may be fabricating with a procedure similar to that illustrated in FIGS. 8 to 11. An etch process may be performed to remove a portion of the energy-removable layer 603. It should be noted that the bottom portion 401B of the first framework layer 401 is still intact after the etch process. The etch rate of the energy-removable layer 603 of the etch process may be faster than the etch rate of the first framework layer 401 of the etch process. For example, an etch rate ratio of the energy-removable layer 603 to the first framework layer 401 may be between about 100:1 and about 1.05:1 during the etch process. For another example, the etch rate ratio of the energy-removable layer 603 to the first framework layer 401 may be between about 20:1 and about 10:1 during the etch process.

With reference to FIG. 21, the second framework layer 403 may be formed on the first framework layer 401. The bottom portion 403B of the second framework layer 403 may be formed on the bottom portion 401B of first framework layer 401. With reference to FIG. 22, the rest elements of the semiconductor device 1C may be fabricated with a procedure similar with that illustrated in FIGS. 14 to 19.

Figure 23:
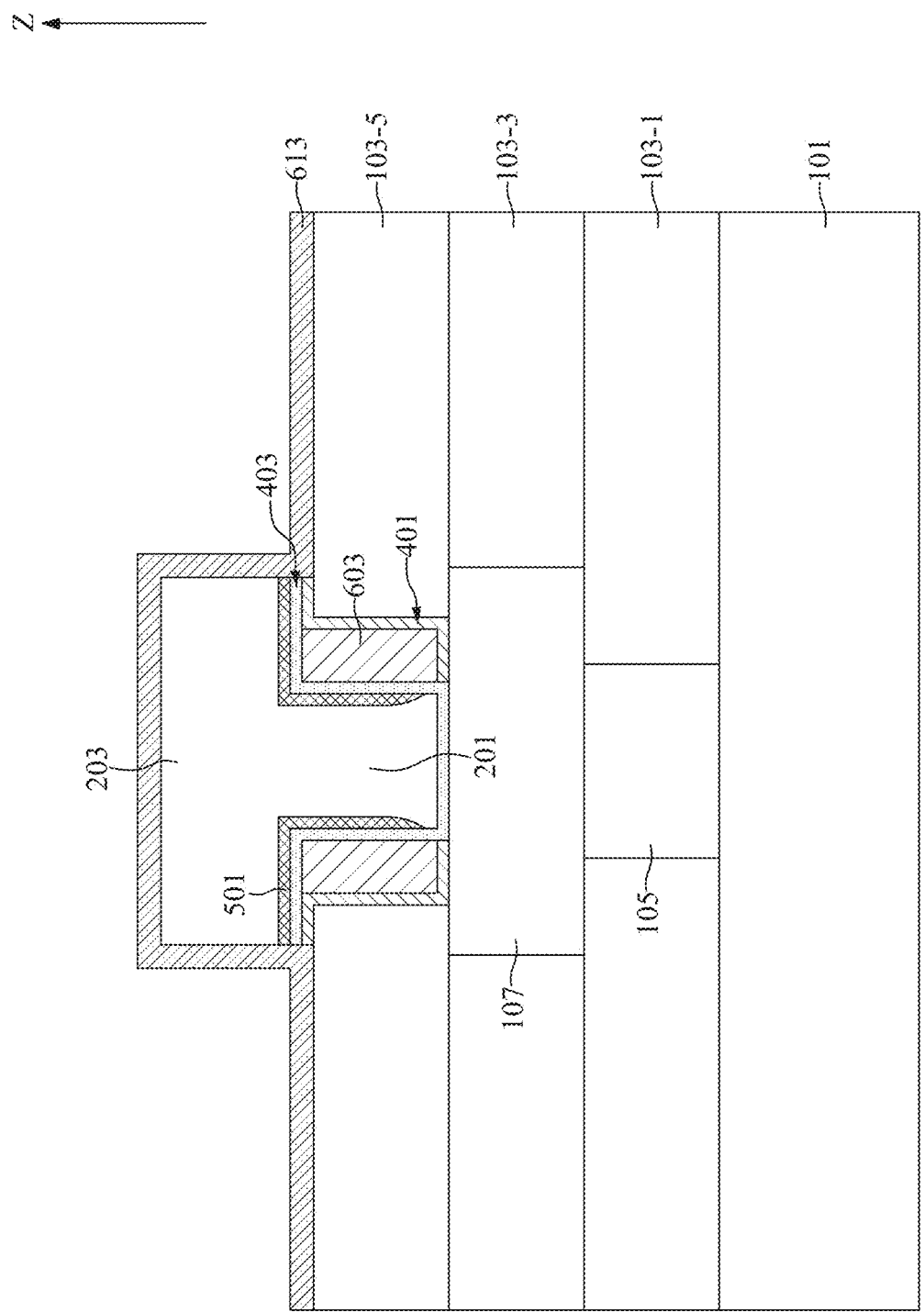
FIGS. 23 to 25 illustrate, in schematic cross-sectional view diagrams, a flow for fabricating a semiconductor device in accordance with another embodiment of the present disclosure.
Figure 24:
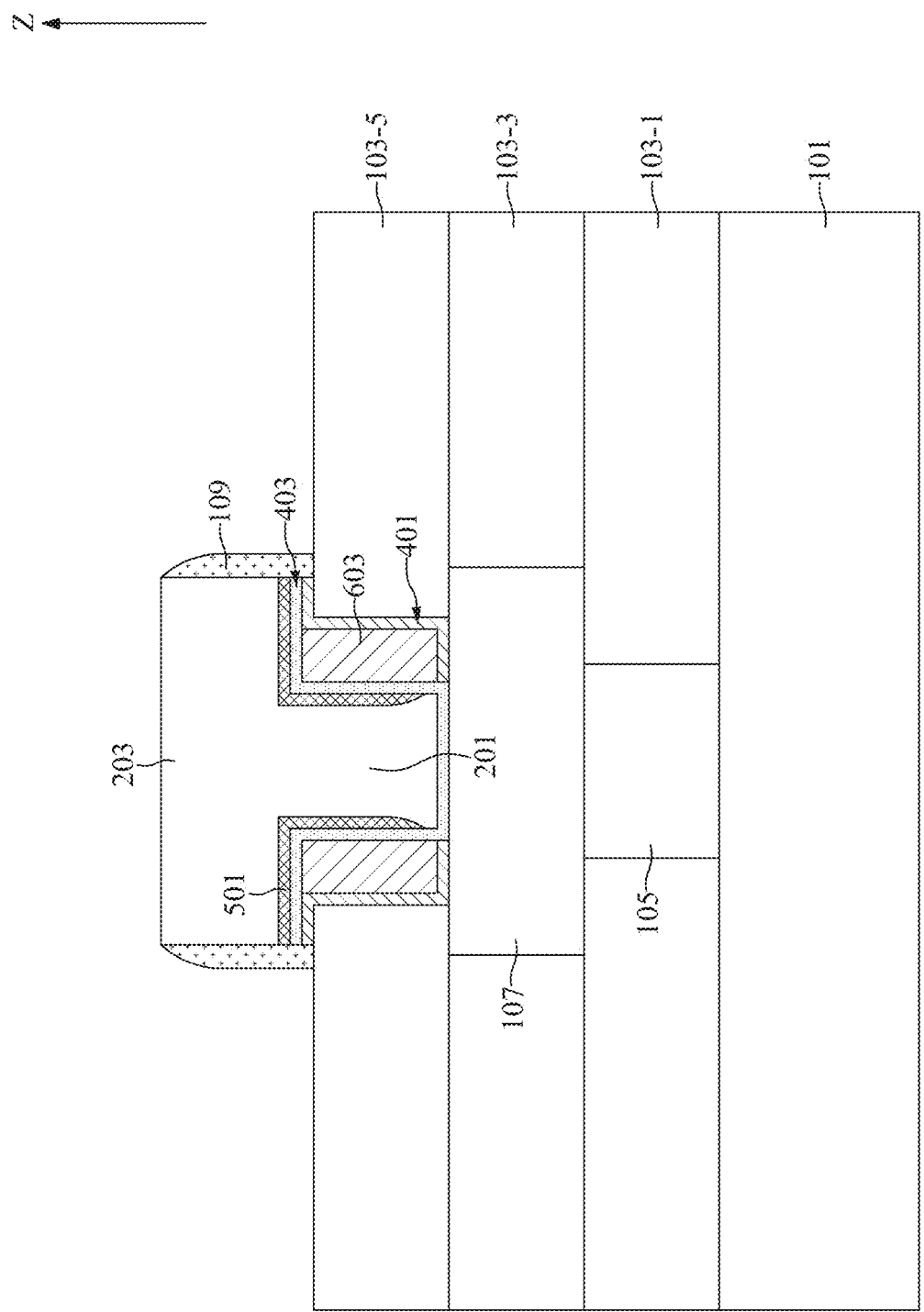
Figure 25:
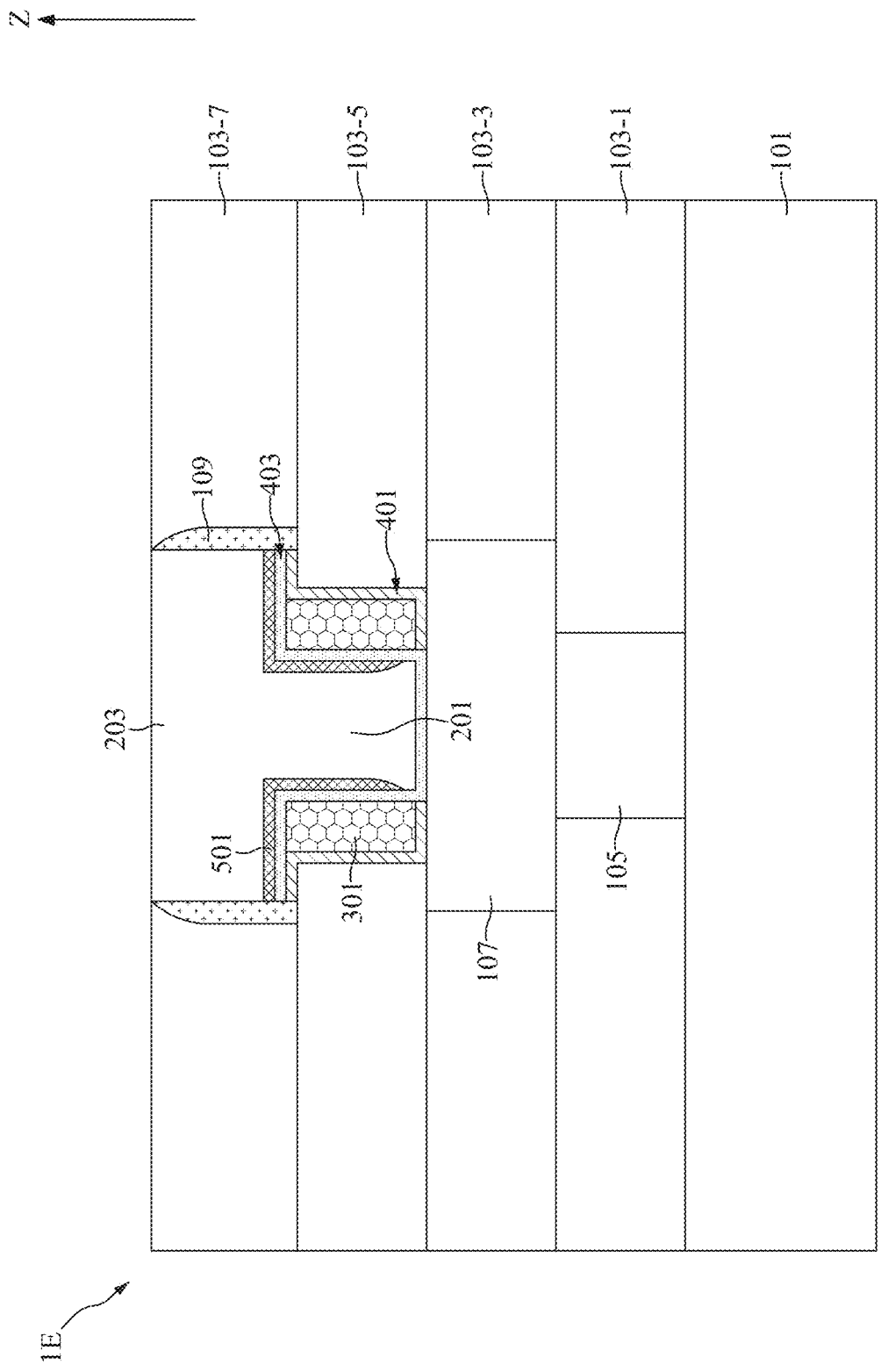

FIGS. 23 to 25 illustrate, in schematic cross-sectional view diagrams, a flow for fabricating a semiconductor device 1E in accordance with another embodiment of the present disclosure.

With reference to FIG. 23, an intermediate semiconductor device may be fabricating with a procedure similar to that illustrated in FIGS. 8 to 17. A layer of first insulating material 613 may be formed to cover the top surface of the first insulating layer 103-5 and the top conductive layer 203. The first insulating material 613 may be, for example, silicon oxide, silicon nitride, silicon carbon nitride, silicon nitride oxide, or silicon oxynitride.

With reference to FIG. 24, an etch process, such as an anisotropic dry etch process, may be performed to remove portions of the layer of first insulating material 613 and concurrently form the spacers 109. With reference to FIG. 25, the first insulating layer 103-7 and the porous insulating layers 301 may be formed with a procedure similar with that illustrated in FIGS. 18 and 19.

One aspect of the present disclosure provides a semiconductor device including a substrate, a top contact positioned above the substrate, a top conductive layer positioned on the top contact, porous insulating layers positioned on two sides of the top contact, first framework layers positioned on bottom surfaces of the porous insulating layers and sidewalls of the porous insulating layers, and a second framework layer positioned between the top contact and the porous insulating layers, positioned on bottom surface of the top contact, and positioned on top surface of the porous insulating layers.

Another aspect of the present disclosure provides a semiconductor device including a substrate, a top contact positioned above the substrate, a top conductive layer positioned on the top contact, porous insulating layers positioned on two sides of the top contact, a first framework layer positioned on bottom surfaces of the porous insulating layers, sidewalls of the porous insulating layers, and on bottom surface of the top contact, and a second framework layer positioned between the top contact and the porous insulating layers, between the top contact and the first framework layers, and positioned on top surface of the porous insulating layers.

Another aspect of the present disclosure provides a method for fabricating a semiconductor device including providing a substrate, forming an insulating layer above the substrate, forming a first opening in the insulating layer, conformally forming a first framework layer in the first opening, forming an energy-removable layer on the first framework layer and filling the first opening, forming a second opening along the energy-removable layer and the first framework layer, conformally forming a second framework layer in the second opening, forming a top contact on the second framework layer and filling the second opening and forming a top conductive layer on the top contact, and performing an energy treatment to transform the energy-removable layer into porous insulating layers on two sides of the top contact.

Due to the design of the semiconductor device of the present disclosure, the porous insulating layers 301 may reduce the parasitic capacitance of the semiconductor device 1A. In addition, with the presence of the covering layers 501, the top contact 201 may be fabricated without any void. Hence, the yield of fabricating the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a top contact positioned above the substrate;
a top conductive layer positioned on the top contact;
porous insulating layers positioned on two sides of the top contact;
first framework layers positioned on bottom surfaces of the porous insulating layers and sidewalls of the porous insulating layers;
a second framework layer positioned between the top contact and the porous insulating layers, positioned on bottom surface of the top contact, and positioned on top surface of the porous insulating layers; and
covering layers positioned between the top contact and the second framework layer positioned between the top contact and the porous insulating layers;
wherein the first framework layers and the second framework layer are formed of a material comprising carbons having hexagonal crystal structures;
wherein thicknesses of the covering layers are gradually decreased toward the substrate.

2. The semiconductor device of claim 1, wherein the first framework layers and the second framework layer are formed graphene, graphite, or the like.

3. The semiconductor device of claim 1, wherein bottommost points of the covering layers are contacting the second framework layer positioned on the bottom surface of the top contact.

4. The semiconductor device of claim 3, wherein the covering layers are formed of aluminum carbide, aluminum nitride, tungsten carbide, or tungsten nitride.

5. The semiconductor device of claim 1, wherein porosities of the porous insulating layers are between about 30% and about 95%.

6. The semiconductor device of claim 5, further comprising a bottom conductive layer below the top contact and a bottom contact positioned below the bottom conductive layer, wherein a width of the top contact is equal to or less than a width of the bottom contact.

7. The semiconductor device of claim 6, further comprising spacers positioned on sidewalls of the top conductive layer.

8. A semiconductor device, comprising:
a substrate;
a top contact positioned above the substrate;
a top conductive layer positioned on the top contact;
porous insulating layers positioned on two sides of the top contact;
a first framework layer positioned on bottom surfaces of the porous insulating layers, sidewalls of the porous insulating layers, and on bottom surface of the top contact; and
a second framework layer positioned between the top contact and the porous insulating layers, between the top contact and the first framework layers, and positioned on top surface of the porous insulating layers;
covering layers positioned between the top contact and the second framework layer positioned between the top contact and the porous insulating layers;
wherein thicknesses of the covering layers are gradually decreased toward the substrate.

* * * * *

UNITED STATES PATENT AND TRADEMARK OFFICE
CERTIFICATE OF CORRECTION

PATENT NO. : 11,424,187 B2
APPLICATION NO. : 16/984828
DATED : August 23, 2022
INVENTOR(S) : Tse-Yao Huang It is certified that error appears in the above-identified patent and that said Letters Patent is hereby corrected as shown below:

On the Title Page

Item [57] should be amended as follows:
The present application discloses a semiconductor device and a method for fabricating the semiconductor device. The semiconductor device includes a substrate, a top contact positioned above the substrate, a top conductive layer positioned on the top contact, porous insulating layers positioned on two sides of the top contact, first framework layers positioned on bottom surfaces of the porous insulating layers and sidewalls of the porous insulating layers, and a second framework layer positioned between the top contact and the porous insulating layers, positioned on bottom surface of the top contact, and positioned on top surface of the porous insulating layers.

Signed and Sealed this
Twenty-third Day of May, 2023

Katherine Kelly Vidal
*Director of the United States Patent and Trademark Office*